United States Patent
Yi et al.

(10) Patent No.: US 10,802,163 B2
(45) Date of Patent: Oct. 13, 2020

(54) SUBSTRATE FOR DIGITAL X-RAY DETECTOR, DIGITAL X-RAY DETECTOR INCLUDING THE SAME AND MANUFACTURING METHOD THEREOF

(71) Applicant: LG Display Co., Ltd., Seoul (KR)

(72) Inventors: Youngjin Yi, Paju-si (KR); Youngyoung Chang, Goyang-si (KR); Jinpil Kim, Paju-si (KR); Hanseok Lee, Goyang-si (KR); Hyeji Jeon, Changwon-si (KR); Younghun Han, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 17 days.

(21) Appl. No.: 16/216,978

(22) Filed: Dec. 11, 2018

(65) Prior Publication Data

US 2019/0187305 A1   Jun. 20, 2019

(30) Foreign Application Priority Data

Dec. 14, 2017   (KR) .......................... 10-2017-0172010

(51) Int. Cl.
*G01T 1/24* (2006.01)
*H01L 27/146* (2006.01)

(52) U.S. Cl.
CPC .............. *G01T 1/247* (2013.01); *G01T 1/241* (2013.01); *H01L 27/14632* (2013.01); *H01L 27/14658* (2013.01); *H01L 27/14687* (2013.01)

(58) Field of Classification Search
CPC .... G01T 1/247; G01T 1/241; H01L 27/14632
See application file for complete search history.

(56) References Cited

U.S. PATENT DOCUMENTS

| 2005/0146648 A1* | 7/2005 | Yang ..................... G02F 1/1368 349/42 |
| 2008/0302969 A1* | 12/2008 | Jung ................. H01L 27/14663 250/370.09 |
| 2010/0176401 A1 | 7/2010 | Lee et al. |
| 2011/0127593 A1* | 6/2011 | Hayashi ............. H01L 27/1461 257/292 |
| 2016/0013243 A1 | 1/2016 | O'Rourke et al. |

FOREIGN PATENT DOCUMENTS

CN    107 359 168 A    11/2017

OTHER PUBLICATIONS

European Patent Office, Extended European Search Report and Opinion, EP Patent Application No. 18211914.9, dated Apr. 30, 2019, 12 pages.

* cited by examiner

*Primary Examiner* — Hugh Maupin
(74) *Attorney, Agent, or Firm* — Fenwick & West LLP

(57) ABSTRACT

A substrate for a digital X-ray detector configured to sense an X-ray signal, a detector including the same, and a manufacturing method thereof. According to an embodiment of the present disclosure, the substrate for an X-ray detector includes an interlayer dielectric layer arranged on a thin film transistor, a first passivation layer and a second passivation layer arranged on the interlayer dielectric layer, and a hydrogen blocking layer arranged on at least one of the first passivation layer and the second passivation layer in a transistor region corresponding to the thin film transistor.

18 Claims, 24 Drawing Sheets

SUBSTRATE FOR DIGITAL X-RAY DETECTOR, DIGITAL X-RAY DETECTOR INCLUDING THE SAME AND MANUFACTURING METHOD THEREOF

CROSS-REFERENCE TO RELATED APPLICATION

This application claims priority under 35 U.S.C. § 119 to Republic of Korea Patent Application No. 10-2017-0172010, filed on Dec. 14, 2017, whose entire disclosure is herein incorporated by reference.

BACKGROUND

1. Field of the Invention

The present disclosure relates to a substrate for a digital X-ray detector configured to sense an X-ray signal, a detector including the same, and a manufacturing method thereof.

2. Description of Related Art

An X-ray inspection method which has been widely used for medical diagnosis requires an X-ray sensing film and a predetermined film printing time to obtain a result.

In recent days, with the development of semiconductor technology, a digital X-ray detector (DXD) using a thin film transistor (TFT) has been researched and developed. Since the DXD uses the TFT as a switching device, an X-ray image may be immediately output at the time of performing an X-ray photography. Therefore, it is possible to diagnose a condition of a subject based on the resulting X-ray image in real time.

In general, the DXD includes an amorphous selenium (Se) layer laminated on an upper layer of a TFT array substrate and a transparent electrode formed on the amorphous Se layer. Two different types of methods are used in the DXD: a direct type DXD method and an indirect type DXD method. The direct type DXD method detects currents as much as a pixel electrode of the TFT receives electric charges from the Se layer and performs a signaling processing procedure. The indirect type DXD method allows a visible ray to be converted into an electrical signal by a PIN diode when an X-ray is converted into the visible ray by a scintillator, and performs a series of signal processing procedures.

The TFT array substrate may be provided so as to detect X-rays, and TFTs may be arranged for each pixel of the TFT array substrate. A photodiode connected to the TFTs may provide a function of sensing the X-rays. A process of generating the photodiode may include a process of degrading a performance of the TFT, and therefore, a configuration and a method for preventing the performance of the TFT from being degraded are required.

SUMMARY OF THE INVENTION

Embodiments relate to a substrate for a digital X-ray detector comprising an active region and a pad region. The active region includes a portion of the base substrate, a plurality of thin film transistors an interlayer dielectric layer arranged on each of the thin film transistors, a first passivation layer and a second passivation layer, a hydrogen blocking layer and a plurality of photodiodes. The portion of a base substrate comprises a plurality of gate lines arranged in a first direction, a plurality of data lines arranged in a second direction to intersect with the plurality of gate lines, and a plurality of bias lines arranged in the first direction or the second direction. The thin film transistors are respectively arranged at intersections of the gate lines and the data lines in pixel regions of an active region. The interlayer dielectric layer is arranged on each of the thin film transistors. The first and second passivation layers are arranged on the interlayer dielectric layer. The hydrogen blocking layer is arranged on at least one of the first passivation layer and the second passivation layer in a transistor region. The photodiodes are arranged on the first passivation layer in the pixel regions. Each of the photodiodes are electrically connected to each of the thin film transistors. The pad region comprising another portion of the base substrate and a pad electrode on the other portion of the base substrate. The pad electrode includes a layer formed of the same material and formed through the same process as the hydrogen blocking layer.

In one or more embodiments, the hydrogen blocking layer is arranged on the second passivation layer. An uppermost layer of the pad electrode is formed of the same material and formed through the same process as the hydrogen blocking layer.

In one or more embodiments, the hydrogen blocking layer is arranged on the first passivation layer. A pixel electrode of a photodiode arranged on the first passivation layer comprises a layer formed of the same material and formed through the same process as the hydrogen blocking layer.

In one or more embodiments, the hydrogen blocking layer and the pixel electrode comprises a first layer including Indium tin oxide (ITO); and a second layer including conductive metal.

In one or more embodiments, the hydrogen blocking layer includes Indium tin oxide (ITO), and the pixel electrode comprises a first layer including the ITO and a second layer including conductive metal.

In one or more embodiments, the pad electrode further comprises: a first layer formed of the same material and through the same process as source and drain electrodes of the thin film transistors, and a second layer formed of the same material and through the same process as the bias lines.

In one or more embodiments, the hydrogen blocking layer is arranged on the first passivation layer, and further comprising another hydrogen blocking layer on the second passivation layer, and the pad electrode further comprises another layer formed of the same material and formed through the same process as the other hydrogen blocking layer.

Embodiments also relate to a digital X-ray detector comprising a substrate comprising an active region and a pad region, a gate driver connected to each of gate lines, a read-out circuit unit connected to each of data lines, and a bias driver connected to each of bias lines.

Embodiments also relate to manufacturing of a substrate for a digital X-ray detector. At least one thin film transistor comprising an active layer, a gate insulating layer, and a gate electrode in an active region of a base substrate is formed. An interlayer dielectric layer is formed on the thin film transistor. Source and drain electrodes on formed the interlayer dielectric layer. A first passivation layer is formed on the source and drain electrodes. Photodiodes are formed on the first passivation layer. A second passivation layer is formed on the photodiodes. A hydrogen blocking layer is formed on the second passivation layer in transistor regions.

In one or more embodiments, the same material as the hydrogen blocking layer is formed on a pad electrode arranged in a pad region.

DETAILED DESCRIPTION OF EXEMPLARY EMBODIMENTS

Figure 1:
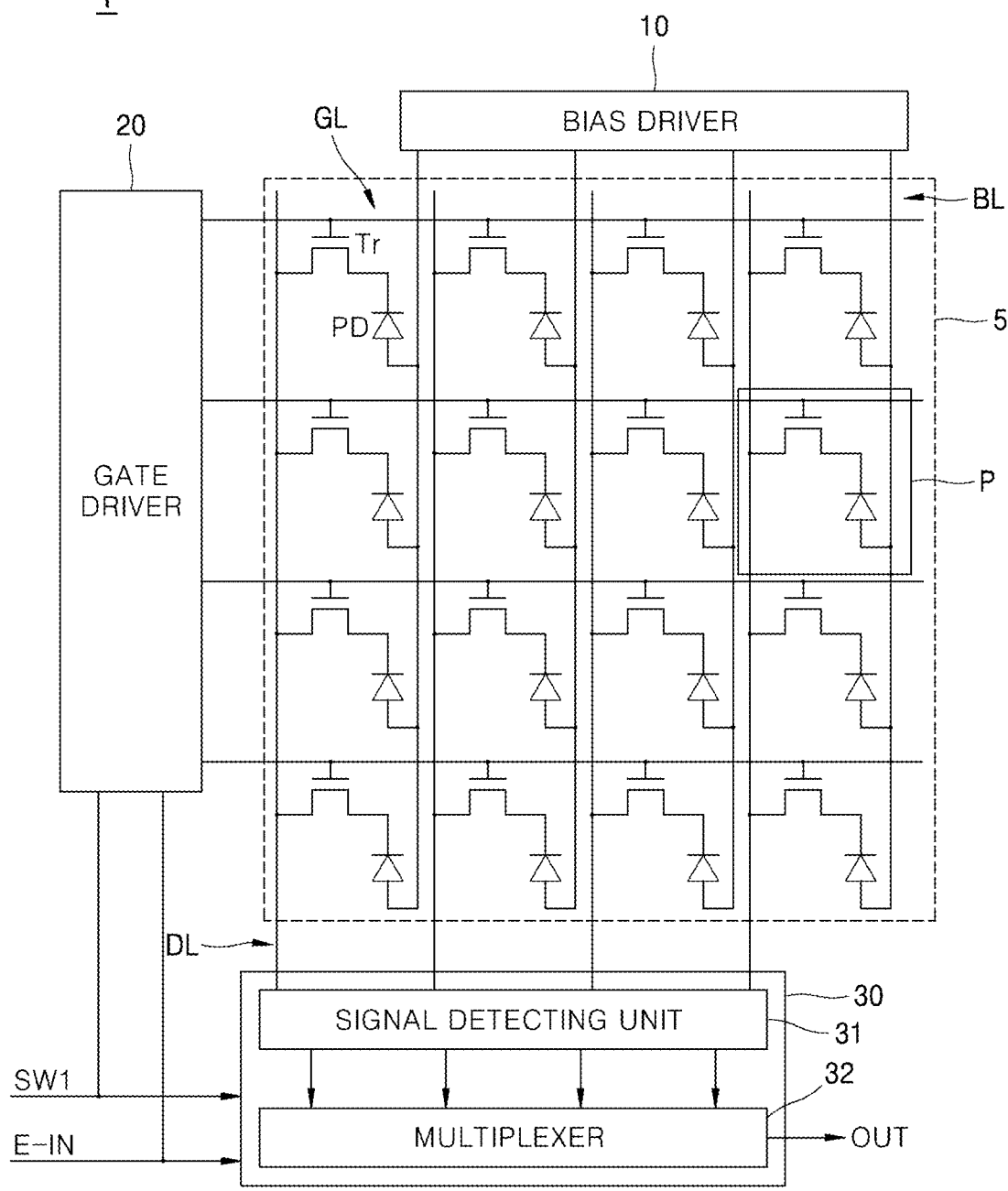
FIG. 1 shows a substrate region of a digital X-ray detector (DXD) according to an embodiment of the present disclosure.

Hereinafter, embodiments of the present disclosure will be described in detailed with reference to the accompanying drawings such that those skilled in the art can easily carry out the invention. The present disclosure is not limited to the embodiments disclosed herein but may be implemented in various different forms.

In order to clearly describe the embodiments, the description irrelevant to the embodiments has been omitted. Same reference numerals designate same or similar elements throughout the specification. Further, some embodiments will be described in detail with reference to the illustrative drawings. Regarding the reference numerals assigned to the elements in the drawings, it should be noted that the same elements will be designated by the same reference numerals, wherever possible, even though they are shown in different drawings. Furthermore, in the description of the embodiments, the detailed description of well-known related configurations or functions will be omitted when it is deemed that such description will cause ambiguous interpretation of the present disclosure.

Hereinafter, the feature that any configuration is provided or arranged on an upper part (or a lower part)" of a base material or "on (or under)" of a base material means that any configuration is provided or arranged in contact with the upper surface (or the lower surface) of the base material, and is not limited to the feature that the other configuration is not included between the base material and any configuration which is provided or arranged on (or under) the base material. In addition, in describing the component of the present invention, the terms such as a first, a second, A, B, (a), (b), etc. can be used. These terms are only intended to distinguish the component from other component, and the nature, the order, the sequence, or the number of the corresponding component are not limited by the terms. When any component is described as being "linked", "coupled", or "connected" to other component, it will have to be understood that the component may be directly linked or connected to other component, whereas other component is 'interposed' between each component, or each component can be "linked", "coupled" or "connected" through other component.

FIG. 1 shows a substrate region of a digital X-ray detector (DXD) according to an embodiment of the present disclosure.

A DXD 1 according to an embodiment of the present disclosure may include a substrate 5, a bias driver 10, a gate driver 20, and a read-out circuit unit 30. The DXD 1 may include the substrate 5 including a plurality of transistors and a photodiode (PD or photo sensor) arranged thereon. Each of the transistors and the PD may form one pixel unit P. A photo converter such as a scintillator may be arranged on the substrate 5. In addition, the DXD 1 may be connected to an additional control device such that the read-out circuit unit 30, the gate driver 20, and the bias driver 10 are controlled according to control of the control device, which will be described later.

Specifically, the substrate 5 may include a base substrate 100 to be described later including lines, a thin film transistor (TFT, Tr, transistor) and the PD arranged thereon. The base substrate 100 may include a plurality of gate lines GL arranged in a first direction (e.g., horizontal direction), and a plurality of data lines DL arranged in a second direction (e.g., vertical direction) different from the first direction. The base substrate 100 may include a plurality of bias lines BL arranged in the first direction or the second direction, and may be divided into an active region including a plurality of pixel regions and a pad region formed outside of the active region. The pad region may be provided with a pad electrode to which the gate driver 20, the read-out circuit unit 30, or the bias driver 10 may be electrically connected. And, the pad electrode may be formed in a process of arranging the TFT.

A pixel unit P may sense an X-ray radiated from an X-ray generator, photo-electrically convert the sensed signal, and output the converted signal as an electrical detection signal. The pixel unit P may include a plurality of photo sensing pixels arranged in a matrix form in the vicinity of a point where the plurality of gate lines GL and the plurality of data lines DL intersect each other. The plurality of gate lines GL may intersect the plurality of data lines DL substantially at right angles. FIG. 1 shows sixteen photo sensing pixels P arranged in four rows and four columns as an example, but embodiments of the present disclosure are not limited thereto. The number of the photo sensing pixels P may vary.

Each of the photo sensing pixels P may include the PD and TFT. The PD may sense an X-ray and output a detection signal, for example, a photo detection voltage. The TFT is a switching device which may transmit an electrical signal output from the PD in response to a gate pulse. The TFT may be arranged at an intersection of the gate line GL and the data line DL in the pixel region. Elements of the TFT (a gate electrode and a conductive region of an active layer) may be electrically connected to the gate line GL and the data line DL, respectively.

The PD according to embodiments of the present disclosure may sense the X-ray radiated from the X-ray generator and output the sensed signal as the detection signal. The PD, which is a device configured to convert light incident by a photoelectric effect into an electrical signal, may be a PIN diode, for example.

The transistor may be a switching device to transmit a detection signal output from the PD. A gate electrode of the transistor may be electrically connected to the gate line GL, and a source electrode of the transistor may be electrically connected to the read-out circuit unit through the data line DL.

The bias driver 10 may be connected to the plurality of bias lines BL to apply a driving voltage to the PD. The bias driver 10 may selectively apply a reverse bias or a forward bias to the PD.

The gate driver 20 may be connected to the plurality of gate lines GL to apply sequentially gate pulses having a gate-on voltage level to the gate lines GL. The transistors of the photo sensing pixels P may be turned on in response to the gate pulses. When the transistor is turned on, the detection signal output from the PD may be input to the read-out circuit unit 30 through the transistor and the data line DL.

The gate driver 20 may be mounted at one side of the pixel unit P in an integrated circuit (IC) form or may be formed on a substrate such as the pixel unit P through a thin film process.

The read-out circuit unit 30 connected to the plurality of data lines DL may read out the detection signal output from the TFT turned on in response to the gate pulses through the data line DL. The read-out circuit unit 30 may read out the detection signal output from the photo sensing pixel P in an offset read-out period in which an offset image is read out, and an X-ray read-out period in which the detection signal is read out after X-ray radiation.

The read-out circuit unit 30 may read out the detection signal and transmit it to a predetermined signal processing unit. The signal processing unit may convert the detection signal into a digital signal, and generate an image from the digital signal. The read-out circuit unit 30 may include a signal detecting unit 31 and a multiplexer 32. In this case, the signal detecting unit 31 may include a plurality of amplifying units respectively corresponding to the plurality of data lines DL, and each of the amplifying units may include an amplifier OP, a capacitor CP, and a reset device SW.

In FIG. 1, the bias driver 10, the gate driver 20, and the read-out circuit unit 30 are collectively referred to as a control circuit unit. The transistor and the PD may be controlled by the control circuit unit, and the signal sensed by the PD may be detected by the control circuit unit. A pad may be arranged to connect the various lines on the substrate 5 to the control circuit units, and the pad may be formed in the process of manufacturing lines.

In FIG. 1, each pixel P may be provided with the TFT and the PD. The pixels each have a small size, and thus a distance between the TFT and the PD may be narrow or the TFT and the PD may partially overlap each other.

In particular, when the TFT is formed on an oxide basis, an oxide TFT may be conductivized in a process of a large amount of hydrogen being introduced. In order to solve this problem, the embodiments of the present disclosure may include an element to prevent degradation of the oxide TFT that forms the DXD.

According to an embodiment of the present disclosure, an interlayer dielectric layer may be arranged on the TFT, and a first passivation layer (PAS1) and a second passivation layer (PAS2) may be arranged on the interlayer dielectric layer, and a hydrogen blocking layer may be arranged on at least one of the PAS1 and the PAS2 in a transistor region corresponding to the TFT, and thereby preventing hydrogen generated during a manufacturing process from penetrating into the TFT. Also, a pad electrode arranged in a pad region may include a layer formed of the same material as the hydrogen blocking layer and through the same process as the hydrogen blocking layer, and thereby improving process efficiency. The terminology of the interlayer dielectric layer can be used as interlayer insulating layer or interlayer insulating film.

A pixel region may be divided into a transistor region and a PD region. Accordingly, the substrate 5 may include plural PDs, and each PD is arranged on the PAS1 to be electrically connected to the TFT in the PD region.

Figure 2:
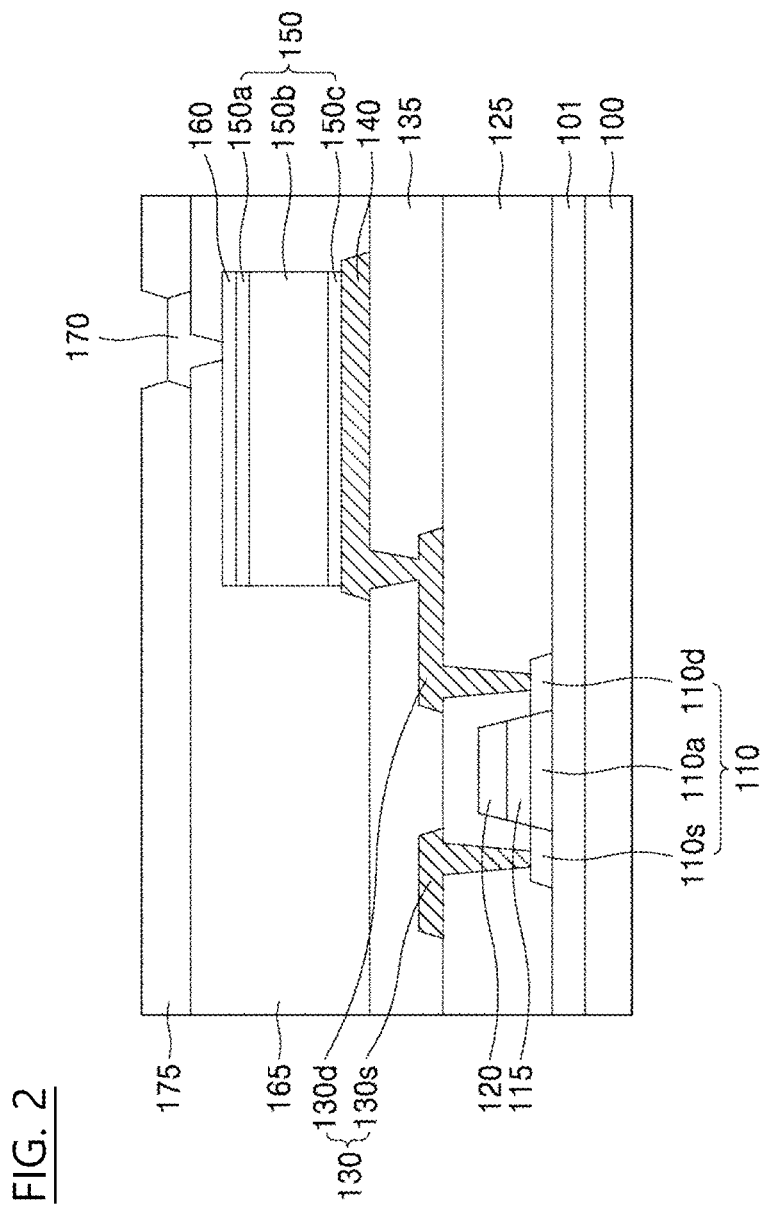
FIG. 2 shows configurations of a thin film transistor (TFT) and a photodiode (PD) that form one pixel in a DXD according to an embodiment of the present disclosure.

FIG. 2 shows configurations of a TFT and a PD that form one pixel in a DXD according to an embodiment of the present disclosure.

A buffer layer 101 may be arranged on a base substrate 100 formed of a material such as polyimide (PI) or glass in which the TFT and PD are arranged, and an active layer 110 forming the oxide TFT may be arranged on the buffer layer 10. More specifically, the active layer 110 may include conductivized regions 110s and 110d and a semi-conductivized region 110a. A gate insulating layer 115 may be arranged on the semi-conductivized region 110a, and a gate electrode 120 may be formed of a conductive material. An interlayer dielectric layer 125 may be arranged on the gate electrode 120. The interlayer dielectric layer 125 may be an oxide interlayer dielectric layer according to an embodiment of the present disclosure.

The interlayer dielectric layer 125 may be partially etched to expose the conductivized regions 110s and 110d of the active layer 110 to form source and drain electrodes 130 (130s and 130d). TFT is connected to the photodiode via the source and drain electrodes. In the same manner, a PAS1 135 may be arranged on the source and drain electrodes 130, and a contact hole to expose a portion 130d of the source and drain electrodes 130 may be formed. Thereafter, a process for manufacturing the PD may be performed.

A pixel electrode 140 connected to the portion 130d of the source and drain electrodes 130 may be arranged on the PAS1, and a PIN diode 150 which is an embodiment of the photodiode may be arranged on the pixel electrode 140. Then, a bias electrode 160 connected to the bias line BL may be arranged on the PIN diode 150.

According to an embodiment of the present disclosure, the PIN diode 150 may include a positive (P) semiconductor layer 150a, an intrinsic (I) semiconductor layer 150b, and a negative (N) semiconductor layer 150c. According to another embodiment of the present disclosure, a positive (P) semiconductor layer 150c, an intrinsic (I) semiconductor layer 150b, and a negative (N) semiconductor layer 150a.

After the pixel electrode 140, the PD 150 and the bias electrode 160 are arranged, the PAS2 165 may be arranged thereon. Thereafter, the PAS2 165 may be etched to expose the bias electrode 160, and then the bias line BL 170 may be arranged thereon. Subsequently, a PAS3 (PAS3) 175 may be arranged thereon, and then the pad may be arranged on an edge of the base substrate 100 that forms the substrate 5. The substrate 5 may include the TFT and the PD arranged for each pixel. The base substrate which forms the substrate 5 is an element formed of glass or polyimide.

FIG. 2 shows a cross-section of one pixel of the substrate 5.

As shown in FIG. 2, in a structure in which the TFT is formed and then the PD formed thereon, that is, the PIN diode 150 is formed on the pixel electrode 140 of the oxide TFT, a large amount of hydrogen may be introduced into the active layer 110 of the TFT by a diode and a subsequent CVD deposition process (forming the PAS2 and the PAS3 after forming P layer-I layer-N layer). The inflow of hydrogen may cause the oxide TFT to be conductivized. Hence, a structure to prevent the inflow of hydrogen may be arranged after the TFT is formed.

Hereinafter, after the oxide TFT process, a configuration of the hydrogen blocking layer to prevent penetration of hydrogen from the diode process by applying indium tin oxide (ITO) or a double metal including ITO to an upper portion of IGZO in an island form will be described. In addition, the hydrogen blocking layer may be formed of IZO, molybdenum, MoTi, Cu, Ag, Ti, Zr, Th, V, Pd, Ni or Sn. Furthermore, the hydrogen blocking layer may be applied to a pad structure in the pad region. Hereinafter, examples in which the hydrogen blocking layer to prevent the penetration of hydrogen is arranged on the semi-conductivized region of the active layer that forms the TFT will be described.

Figure 3:
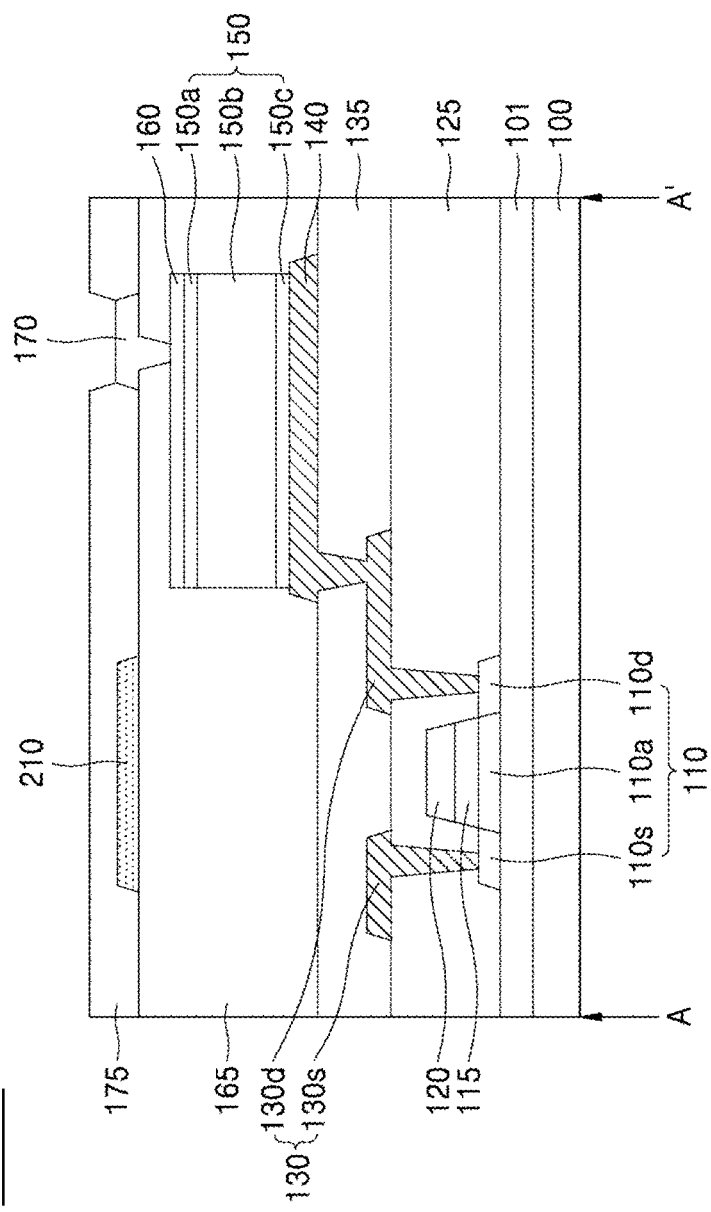
FIGS. 3 to 5 each show a structure and a process of arranging a hydrogen blocking layer before depositing a third passivation layer (PAS3) according to an embodiment of the present disclosure.
Figure 4:
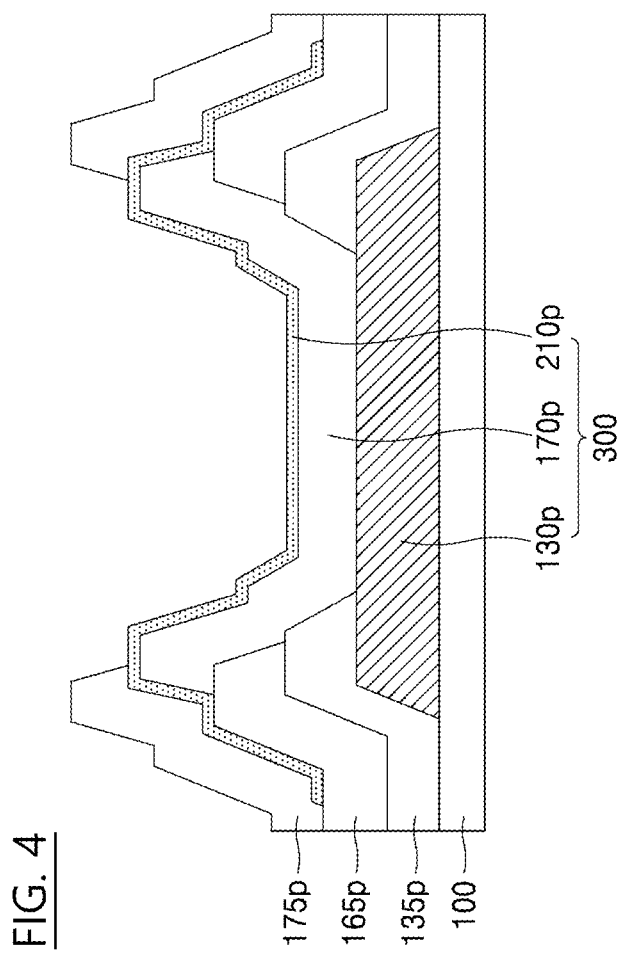
Figure 5:
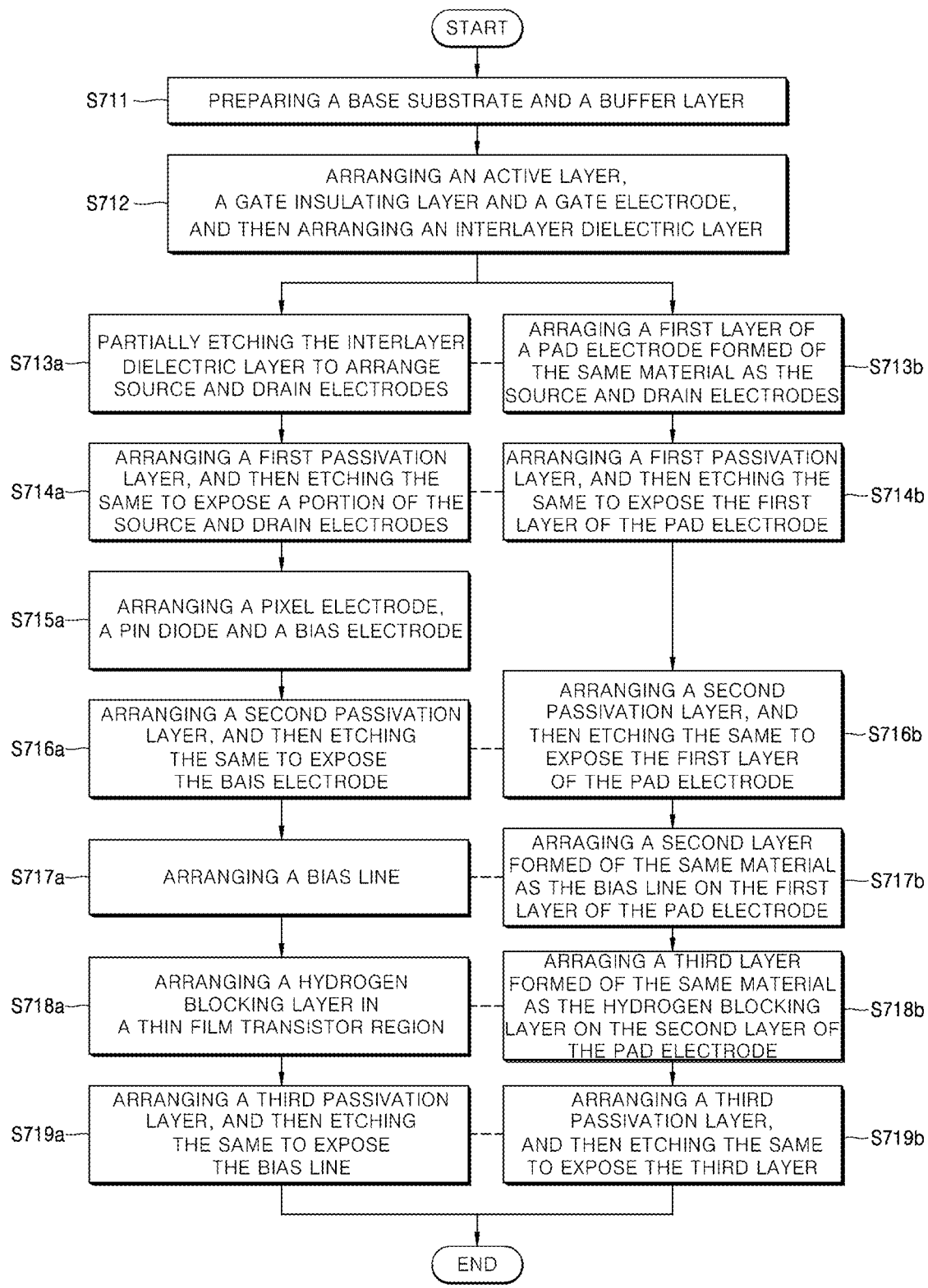

FIGS. 3 to 5 show a structure and a process of arranging a hydrogen blocking layer before depositing the PAS3 (PAS3) according to an embodiment of the present disclosure.

FIG. 3 shows a hydrogen blocking layer arranged on the TFT before depositing the PAS3 according to an embodiment of the present disclosure. The lamination processes of FIGS. 15 to 19 to be described later are applied to FIG. 3, and FIG. 3 is an embodiment of the cross-section taken along line A-A' of FIG. 19.

When comparing FIG. 3 to FIG. 2, FIG. 3 shows a hydrogen blocking layer 210, which is formed of ITO according to an embodiment of the present disclosure, arranged on the PAS2 165 before the PAS3 175 is deposited. Since the hydrogen blocking layer 210 is arranged before the PAS3 175 is deposited, it is possible to block hydrogen generated during the process of forming the PAS3. According to an embodiment of the present disclosure, when the PAS3 175 is formed of an inorganic film containing hydrogen, hydrogen may be generated. That is, a passivation layer may be formed of the inorganic film for reliability of the PD and the TFT. When such an inorganic film contains hydrogen, the hydrogen may be released in the process of forming the passivation layer. The released hydrogen may be combined with an electrode or a conductive material of the TFT, which may degrade an electrical property of the TFT. Accordingly, when hydrogen contained in a constituent material of the PAS3 is generated during the process of forming the PAS3, the hydrogen blocking layer 210 according to embodiments of the present disclosure may block the hydrogen, thereby enhancing the performance of the TFT.

FIG. 4 shows a configuration of a pad in a pixel structure as shown in FIG. 3. In FIG. 1, the bias driver 10 or the read-out circuit unit 30 may be bonded to the pad of the substrate 5. More specifically, FIG. 4 shows a structure of a pad arranged in a pad region which is an edge of the base substrate 100. In the same manner as arranging the hydrogen blocking layer 210 in FIG. 3, FIG. 4 shows an uppermost layer 210p of the pad electrode formed through the same process as the hydrogen blocking layer 210.

The uppermost layer 210p of the pad electrode 300 may be formed of the same material and through the same process as the hydrogen blocking layer (210 of FIG. 3).

Since the process of the pixel region of FIG. 3 and the process of the pad region of FIG. 4 are performed at the same time, the designator "p" is added to an element formed of the same material through the same process. The hydrogen blocking layer 210 and the uppermost layer 210p of the pad electrode 300 may be formed at the same time, so that the process efficiency may be improved and the pad electrode 300 may also protected by a hydrogen blocking material such as ITO.

More specifically, the pad electrode 300 of FIG. 4 may include a first layer 130p formed through the same process as the source and drain electrodes 130 of FIG. 3, a second layer 170p formed through the same process as the bias line BL of FIG. 3, and a third layer 210p formed through the same process as the hydrogen blocking layer 210 of FIG. 3. With respect to the PAS1 135p, the PAS2 165p, and the PAS3 175p, the configurations of the PAS1 to PAS3 described in relation to FIG. 3 are applied thereto. Therefore, the processes of FIGS. 3 and 4 will be described in detail with reference to FIG. 5.

FIG. 5 shows a process of arranging a TFT and a PD, and arranging a pad thereon according to an embodiment of the present disclosure.

A base substrate 100 and a buffer layer 101 may be prepared (S711). More specifically, the buffer layer 101 may be arranged on the base substrate 100. An active layer 110, a gate insulating layer 115 and a gate electrode 120 may be arranged on the base substrate 100, and the active layer 110 may be divided into conductivized regions 110s and 110d and a non-conductivized region 110a through a predetermined doping process. Thereafter, an interlayer dielectric layer 125 may be arranged thereon (S712). The interlayer dielectric layer 125 and the buffer layer 101 may not be arranged in the pad region in the steps S711 and S712. To state concisely, in the step S712, at least one TFT including the active layer 110, the gate insulating layer 115 and the gate electrode 120 may be arranged in each of the pixel regions of the active region of the base substrate 110, and the interlayer dielectric layer 125 may be arranged thereon according to an embodiment of the present disclosure.

Subsequent processes will be described based on the respective regions (the pixel region and pad region).

In the pixel region, the interlayer dielectric layer may be partially etched to arrange the source and drain electrodes 130 (S713a). The reason for etching the interlayer dielectric layer is to form a contact hole so that the conductivized regions 110s and 110d of the active layer 110 and the source and drain electrodes 130 may be electrically connected to each other. In the pad region, the first layer 130p of the pad electrode formed of the same material as the source and drain electrodes 130 may be arranged (S713b).

Next, in the pixel region, the PAS1 135 may be arranged on the source and drain electrodes 130, and then may be etched to expose a portion of the source and drain electrodes 130 (S714a). In the pad region, the PAS1 135p may be arranged through the same process, and then may be etched to expose the first layer 130p of the pad electrode (S714b).

Next, the pixel electrode 140, PIN diode 150, and bias electrode 160 may be arranged in the pixel region (S715a). That is, said elements of the PD 140, 150, and 160 may be arranged on the PAS1 135 in the pixel region.

Thereafter, a process of arranging the PAS2 on the PD and etching the same may be performed in the pixel region and the pad region. That is, the PAS2 165 may be arranged and etched to expose the bias electrode 160 (S716a). In the pad region, the PAS2 165p may be arranged through the same process, and then may be etched to expose the first layer 130p of the pad electrode (S716b).

Thereafter, the bias line BL may be arranged in the pixel region (S717a), and the second layer 170p formed of the same material as the bias line BL may be arranged on the first layer 130p of the pad electrode in the pad region (S717b).

Also, in the pixel region, the hydrogen blocking layer 210 may be arranged to prevent the penetration of hydrogen in the TFT region (transistor region), more specifically, in the active layer 110 or the non-conductivized region 110a of the active layer 110 (S718a). In the process, the hydrogen blocking layer 210 may be arranged in a larger region than the active layer 110.

In the pad region which is formed outside of the active region of the base substrate 100, a layer formed of the same material and through the same process as the hydrogen blocking layer may be arranged on the pad electrode. According to an embodiment of the present disclosure, a third layer 210p formed of the same material as the hydrogen blocking layer 210 may be arranged on the second layer 170p of the pad electrode (S718b).

In the pixel region, the PAS3 175 may be arranged on the hydrogen blocking layer 210, and then may be etched to expose the bias line BL (S719a). In the pad region, the PAS3 175p may be arranged on the third layer 210p, and then may be etched to expose the third layer 170p (S719b).

The hydrogen blocking layer 210 arranged in the pixel region may prevent hydrogen from flowing into the TFT. In the same process, the third layer 210p of the pad electrode 300 may prevent corrosion of metal that forms the pad electrode. For this purpose, the hydrogen blocking layer 210 and the third layer 210p of the pad electrode 300 may be formed of ITO. Since the process of arranging the hydrogen blocking layer 210 and the process of arranging the uppermost layer 210p of the pad electrode are performed at the same time, it is possible to improve the process efficiency and prevent hydrogen from flowing into the transistor.

FIGS. 6 to 14 each show a structure and a process of arranging a hydrogen blocking layer before depositing a PAS2 according to an embodiment of the present disclosure.

Figure 6:
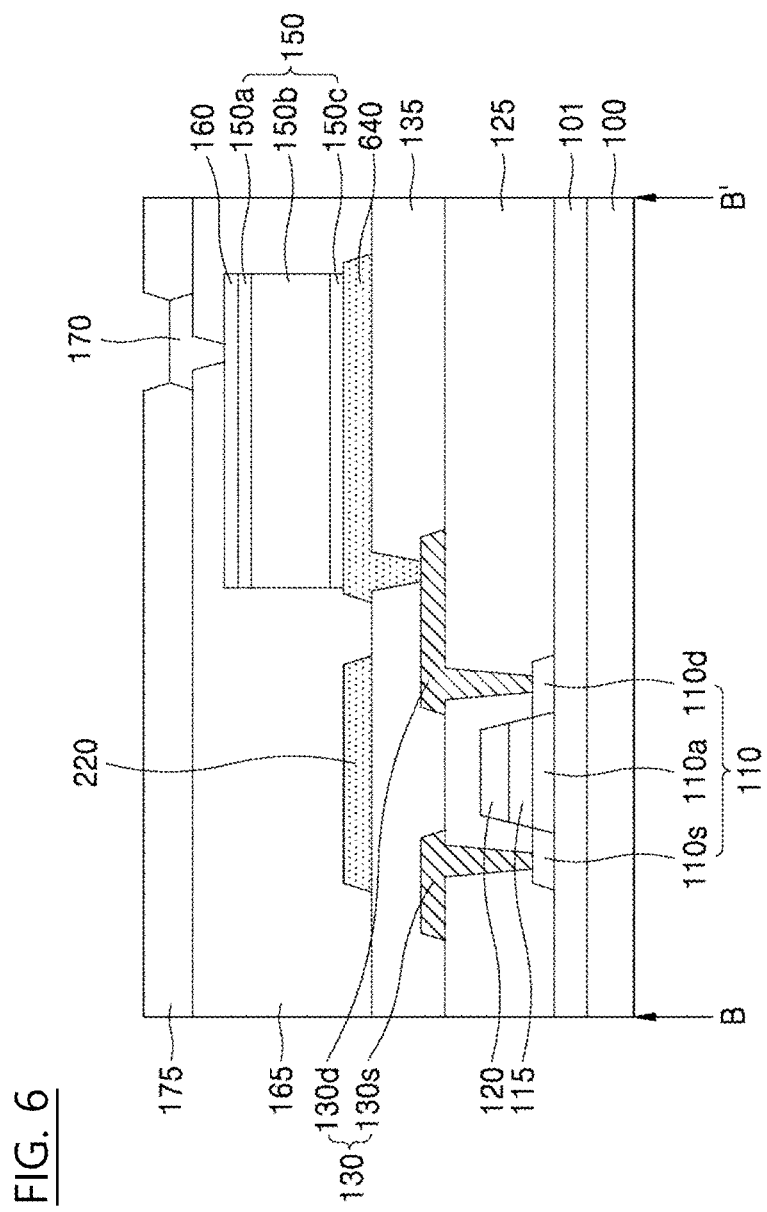
FIGS. 6 to 14 each show a structure and a process of arranging a hydrogen blocking layer before depositing a second passivation layer (PAS2) according to an embodiment of the present disclosure.

FIG. 6 shows a hydrogen blocking layer arranged on the TFT before depositing the PAS2 according to an embodiment of the present disclosure.

When comparing FIG. 6 to FIG. 2, FIG. 6 shows a hydrogen blocking layer 220, which is formed of ITO according to an embodiment of the present disclosure, may be arranged on the PAS1 135 before the PAS2 165 is deposited. Accordingly, it is possible to block hydrogen generated during the process of forming the PIN diode 150, the process of forming the PAS2 165, the process of forming the PAS3 175. In addition, it is possible to improve the process efficiency by arranging the pixel electrode 640 formed of the same material (ITO according to an embodiment of the present disclosure) as the hydrogen blocking layer 220 through the same process as the hydrogen blocking layer 220. That is, the pixel electrode 640 may include a layer formed of the same material as the hydrogen blocking layer 220 through the same process as the hydrogen blocking layer 220.

Figure 7:
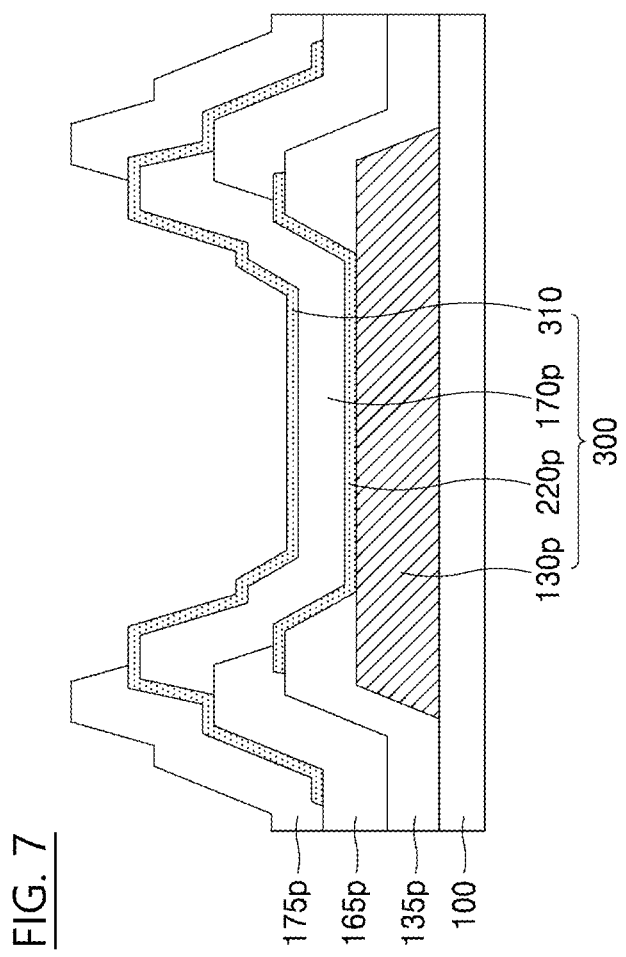

FIG. 7 shows a configuration of a pad in a pixel structure as shown in FIG. 6. The pad electrode may include a first layer 130p formed of the same material and through the same process as the source and drain electrodes 130 to connect the TFT and the PD, a second layer 220p formed of the same material and through the same process as the hydrogen blocking layer, and a third layer 170p formed of the same material and through the same process as the bias line 170. And, the pad electrode may selectively include a fourth layer 310.

Referring to FIGS. 4 and 7, and 10 and 13 to be described later, the pad electrode in the pad region may be formed of the same materials as the materials used in the process of arranging the TFT and the PD in the active region. Accordingly, it is possible to improve the process efficiency.

FIG. 7 shows a structure of a pad arranged in a pad region which is an edge of the base substrate 100. In the same manner as arranging the hydrogen blocking layer 220 in FIG. 6, FIG. 7 shows one layer 220p of the pad electrode formed through the same process as the hydrogen blocking layer 220 and the pixel electrode 640 of FIG. 6. Since the process of the pixel region of FIG. 6 and the process of the pad region of FIG. 7 are performed at the same time, the designator "p" is added to an element formed of the same material through the same process. In FIG. 7, the fourth layer 310 formed of a separate ITO material may be selectively arranged on the uppermost layer of the pad electrode 300.

More specifically, FIG. 7 shows the pad electrode 300 including the first layer 130p formed through the same process as the source and drain electrodes 130 of FIG. 6, the second layer 220p formed through the same process as the hydrogen blocking layer 220 and the pixel electrode 640 of FIG. 6, and the third layer 170p formed through the same process as the bias line BL of FIG. 6. And, the pad electrode 300 may selectively include the fourth layer 310 including ITO. With respect to the PAS1 135p, the PAS2 165p, and the PAS3 175p, the configurations of the PAS 1 to 3 described in relation to FIGS. 3 and 6 are applied thereto.

Figure 8:
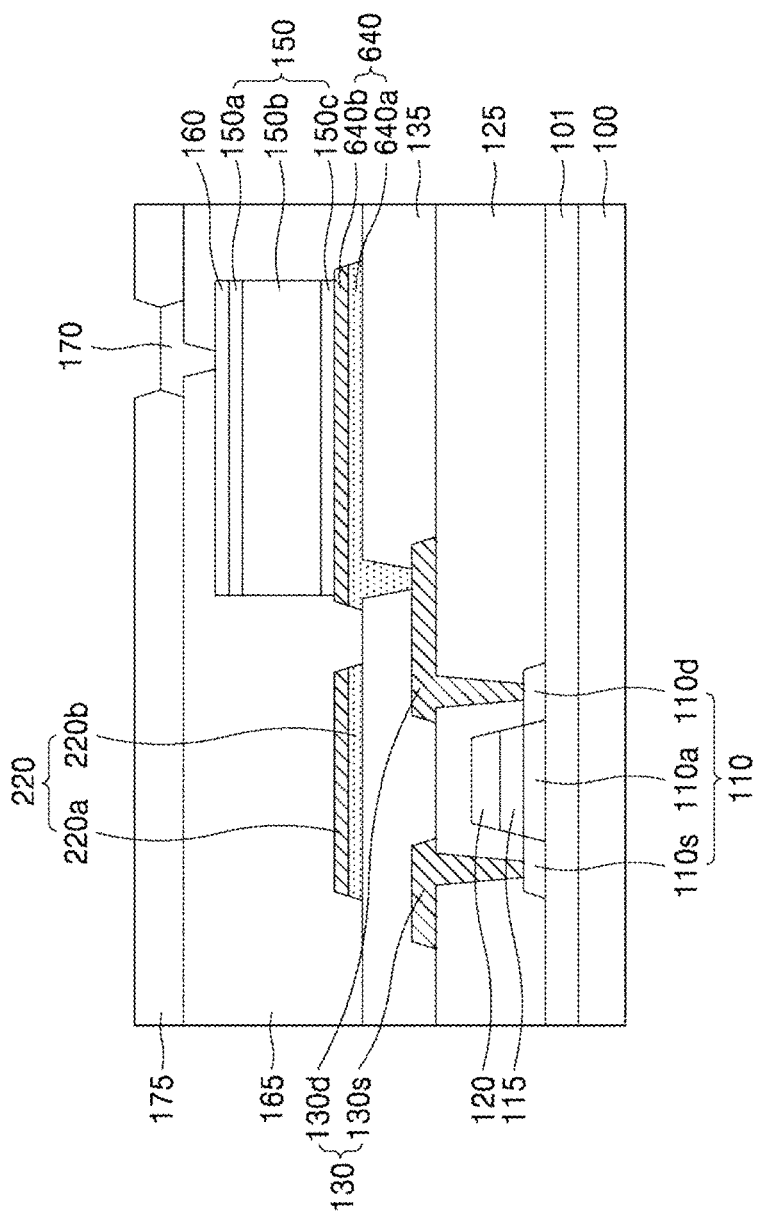

FIG. 8 shows a hydrogen blocking layer arranged in a double-layer manner according to an embodiment of the present disclosure. FIG. 8 is the same as FIG. 6 in terms of a configuration, but is different from FIG. 6 in that the hydrogen blocking layer 220 includes the first layer 220a including ITO and the second layer 220b including conductive metal. The pixel electrode 640 also may include a first layer 640a including ITO and a second layer 640b including conductive metal. The sequence of laminating the first layer 640a and the second layer 640b may be changed from that of FIG. 8. For example, a lower layer may include conductive metal, and an upper layer may include ITO.

The double-layered structure as shown in FIG. 8 may improve the hydrogen blocking efficiency, and the pixel electrode 640 including conductive metal may improve an electrical effect. Further, the hydrogen blocking layer 220, which also includes conductive metal 220b, may be arranged through the same process as the pixel electrode 640, thereby improving the process efficiency.

Figure 9:
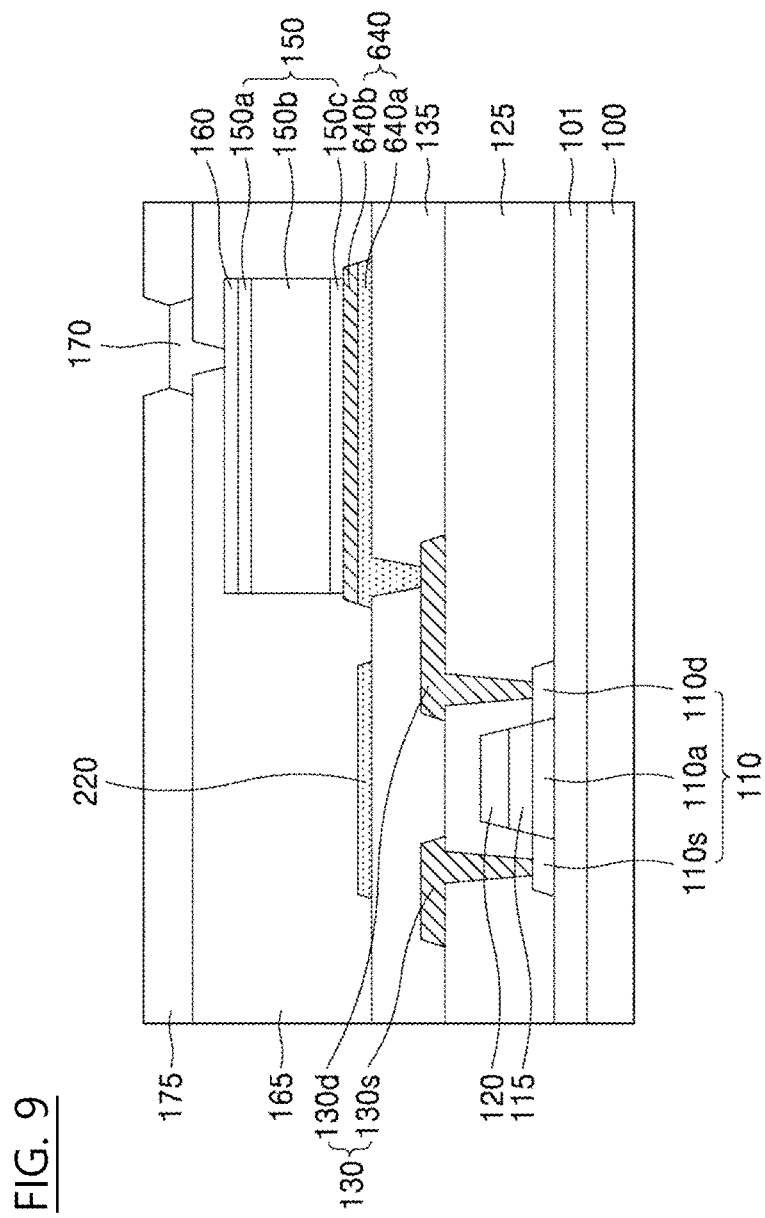

FIG. 9 shows a hydrogen blocking layer arranged in a single-layer manner, and a pixel electrode arranged in a double-layer manner according to another embodiment of the present disclosure. FIG. 9 is the same as FIG. 6 in terms of a configuration of the hydrogen blocking layer 220, and is the same as FIG. 8 in terms of a configuration of the double-layered pixel electrode 640a and 640b.

The single-layered/double-layered structure as shown in FIG. 9 may improve the hydrogen blocking efficiency, and the pixel electrode 640 including conductive metal may improve an electrical effect.

FIGS. 8 and 9 each show a single-layered or double-layered hydrogen blocking layer, and a double-layered pixel electrode. The pad electrode corresponding to the pixel electrode may include only the hydrogen blocking layer as shown in FIG. 7, or may be arranged in a double-layer manner in the same manner as the pixel electrode, which will be described in detail with reference to FIG. 10.

Figure 10:
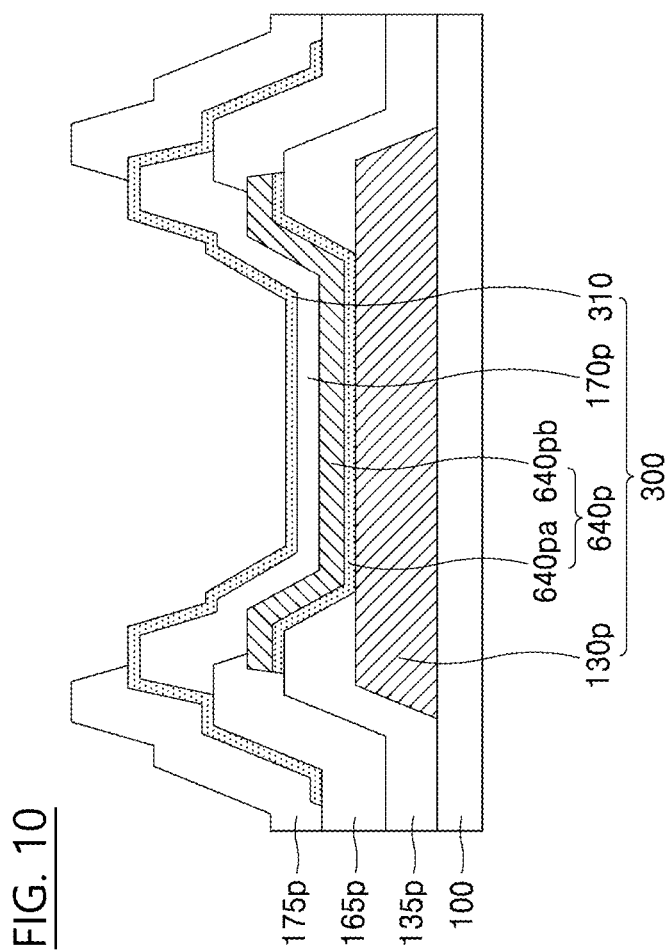

FIG. 10 shows a configuration of a pad in the pixel structure as shown in FIGS. 8 and 9. FIG. 10 shows a structure of a pad arranged in a pad region which is an edge of a base substrate 100. In the same manner as the hydrogen blocking layer 220 and the pixel electrode 640 in FIGS. 8 and 9, the pad electrode may include one layer 640*pa* and 640*pb* in a double-layered manner through the same process. Since the process of the pixel region of FIGS. 8 and 9 and the process of the pad region of FIG. 10 are performed at the same time, the designator "p" is added to an element formed of the same material through the same process. In FIG. 10, the fourth layer 310 formed of a separate ITO material may be selectively arranged on the uppermost layer of the pad electrode 300.

More specifically, FIG. 10 shows that the pad electrode 300 may include a first layer 130*p* formed through the same process as the source and drain electrodes 130 of FIGS. 8 and 9, a second layer 640*pa* and 640*pb* formed through the same process as the hydrogen blocking layer 220 and the pixel electrode 640 of FIGS. 8 and 9, a third layer 170*p* formed through the same process as the bias line BL of FIGS. 8 and 9, and a fourth layer 310 selectively including ITO. With respect to the PAS1 135*p*, the PAS2 165*p*, and the PAS3 175*p*, the configurations of the PAS1 to 3 described above are applied thereto. FIG. 10 shows that the second layer 640*pa* and 640*pb* may have a double-layered structure formed of two materials, unlike FIG. 7.

Hereinafter, the processes of FIGS. 6 to 10 will be described.

Figure 11:
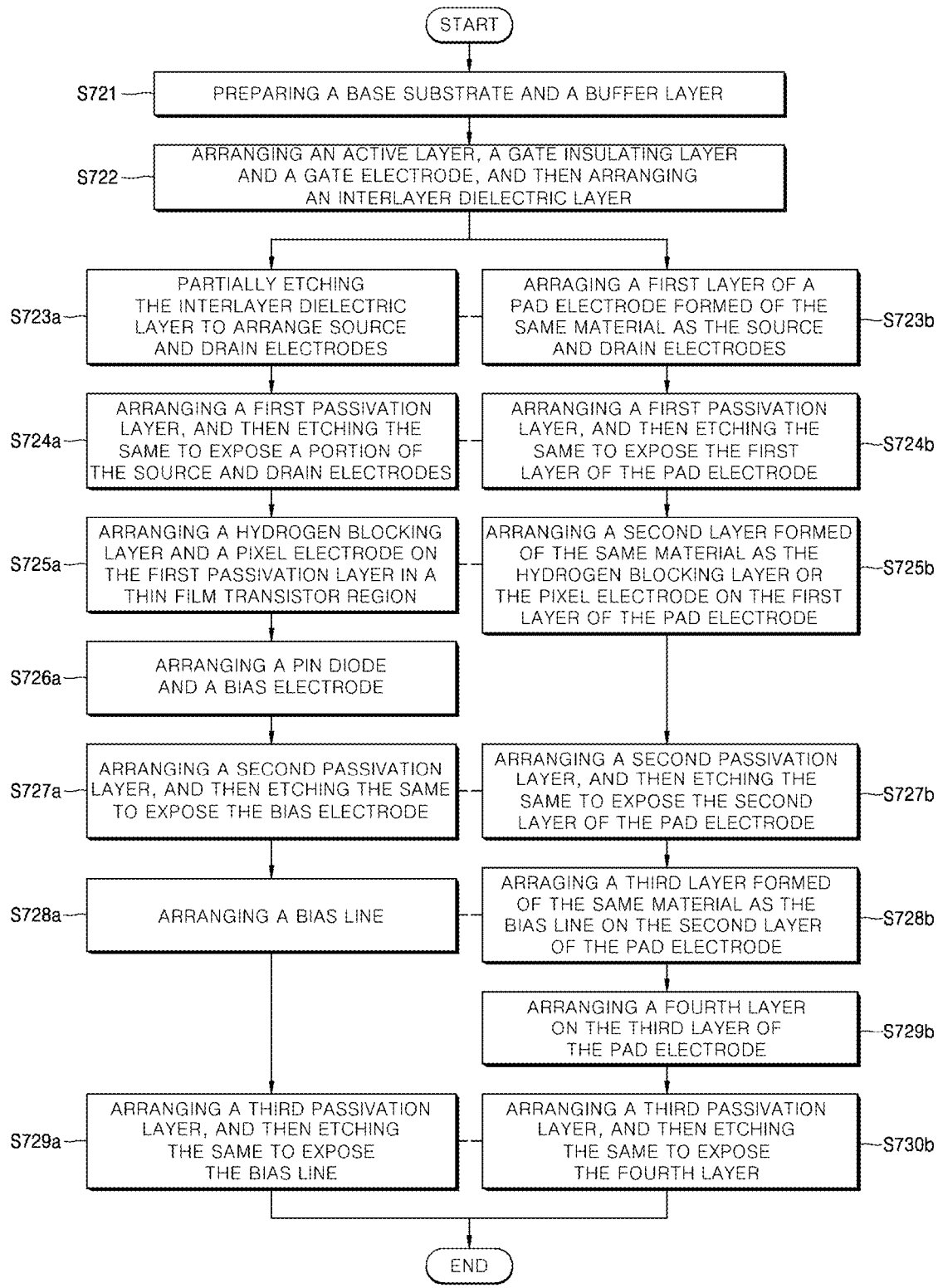

FIG. 11 shows a process of arranging a hydrogen blocking layer on a PAS2 according to an embodiment of the present disclosure. A base substrate 100 and a buffer layer 101 may be prepared (S721). More specifically, the buffer layer 101 may be arranged on the base substrate 100. An active layer 110, a gate insulating layer 115 and a gate electrode 120 may be arranged on the base substrate 100, and the active layer 110 may be divided into conductivized regions 110*s* and 110*d* and a non-conductivized region 110*a* through a predetermined doping process. The terminology of the gate insulating layer can be used as gate insulating film.

Thereafter, an interlayer dielectric layer 125 may be arranged thereon (S722). The interlayer dielectric layer 125 and the buffer layer 101 may not be arranged in the pad region in the steps S721 and S722. To state concisely, in the step S722, at least one TFT including the active layer 110, the gate insulating layer 115 and the gate electrode 120 may be arranged in each of the pixel regions of the active region of the base substrate 110, and the interlayer dielectric layer 125 may be arranged thereon according to an embodiment of the present disclosure.

Subsequent processes will be described based on the respective regions, the pixel region and pad region.

In the pixel region, the interlayer dielectric layer may be partially etched to arrange source and drain electrodes 130 (S723*a*). The reason for etching the interlayer dielectric layer is to form a contact hole so that the conductivized regions 110*s* and 110*d* of the active layer 110 and the source and drain electrodes 130 may be electrically connected to each other. In the pad region, a first layer 130*p* of the pad electrode formed of the same material as the source and drain electrodes 130 may be arranged (S723*b*).

Next, in the pixel region, the PAS1 135 may be arranged on the source and drain electrodes 130, and then may be etched to expose a portion of the source and drain electrodes 130 (S724*a*). In the pad region, the PAS1 135*p* may be arranged on the first layer 130*p* through the same process, and then may be etched to expose the first layer 130*p* of the pad electrode (S724*b*).

Next, the hydrogen blocking layer may be arranged. That is, the hydrogen blocking layer may be arranged on the PAS1 135 in the TFT region (transistor region) among the pixel regions, and the pixel electrode 640 may be arranged on the PAS1 135 in the PD region (S725*a*) among the pixel regions. Here, the hydrogen blocking layer 220 and the pixel electrode 640 may have a single-layered structure formed of an ITO material as shown in FIG. 6.

Also, as shown in FIG. 8, the hydrogen blocking layer 220 and the pixel electrode 640 each may have a double-layered structure formed of ITO and conductive metal, that is, the hydrogen blocking layer 220 and the pixel electrode 640 may include one layer formed of ITO 220*a* and 640*a* and the other layer formed of conductive metal 220*b* and 640*b*. As shown in FIG. 9, the hydrogen blocking layer 220 may have a single-layered structure, and the pixel electrode 640 may have a double-layered structure 640*a* and 640*b*. Here, the hydrogen blocking layer 220 and the first layer 640*a* of the pixel electrode 640 may be formed of ITO and the second layer 640*b* of the pixel electrode may be formed of conductive metal.

To state concisely, the step S725*a* may include a process of arranging the hydrogen blocking layer 220 on the PAS1 135 in the transistor region corresponding to the TFT among the pixel regions and arranging the pixel electrode 640 formed of the same material as the hydrogen blocking layer 220 on the PAS1 135 in the PD region among the pixel regions.

In the pad region, the second layer 220*p* formed of the same material as the hydrogen blocking layer 220 or the pixel electrode 640 in the pixel region may be arranged on the first layer 130*p* of the pad electrode through the same process as that performed in the step S725*a* (S725*b*). The pad electrode may include a layer formed of the same material as the hydrogen blocking layer and through the same process as the hydrogen blocking layer, thereby improving process efficiency.

According to the embodiment of FIGS. 6 and 7, the second layer 220*p* of the pad electrode may have a single-layered structure formed of ITO. Alternatively, the second layer 640*p* of the pad electrode may have a double-layered 640*pa*, 640*pb*, which has the same structure 640*a* and 640*b* of the pixel electrode 640 as shown in FIGS. 9 and 10.

Next, the PIN diode (PIN layer) 150 and the bias electrode 160 may be arranged only in the pixel region (S726*a*).

Then, a process of arranging the PAS2 on the PD and then etching the same may be performed in the pixel region and the pad region. That is, the PAS2 165 may be arranged, and then may be etched to form a contact hole to expose the bias electrode 160 (S727*a*). In the pad region, the PAS2 165*p* may be arranged on the second layer 220*p* of FIG. 7 or 640*p* of FIG. 10 of the pad electrode, and then may be etched to expose the second layer 220*p* of FIG. 7 or 640*p* of FIG. 10 (S727*b*).

Thereafter, a bias line BL may be arranged in the pixel region (S728*a*), and a third layer (170*p*) formed of the same material as the bias line BL may be arranged on the second layer of the pad electrode in the pad region (S728*b*). The contact hole may be formed in the PAS2 165 to expose a portion of the bias electrode 160, and the bias line BL may be arranged thereon to be electrically connected to the bias electrode 160 of the PD.

Also, in the pixel region, the hydrogen blocking layer 210 may be arranged to prevent the penetration of hydrogen in the TFT region, more specifically, in the active layer 110 or the non-conductivized region 110*a* of the active layer 110 (S728*a*). In the meantime, a fourth layer 310 may be selectively arranged on the third layer 170*p* of the pad electrode in the pad region (S729*b*).

Thereafter, the PAS3 175 may be arranged and etched to expose the bias line BL in the pixel region (S730a). In the pad region, the PAS3 175p may be arranged and etched to expose the fourth layer 310 (S730b). When the step S729b is not performed, the PAS3 175p may be arranged and etched to expose the third layer 170p in the step S730b.

The hydrogen blocking layer 220 in the pixel region may prevent hydrogen from flowing into the TFT. Since the hydrogen blocking layer 220 may be arranged on the PAS1 135, the hydrogen blocking layer 220 may prevent hydrogen from flowing into the TFT during subsequent processes of arranging the PIN diode 150, the PAS2 165 and the PAS3 175. As a result, it is possible to prevent the degradation of the TFT.

Referring to FIGS. 6 to 11, an ITO layer may be formed in an island form on the TFT as a hydrogen blocking layer 220 in the process of depositing the pixel electrode. Here, the pixel electrode and the hydrogen blocking layer may have a single-layered structure formed of only ITO as shown in FIG. 6, or a double or triple-layered structure formed of ITO and conductive metal as shown in FIG. 8 according to an embodiment. Also, as shown in FIG. 9, the pixel electrode may be formed of a double metal, but may have a structure in which only ITO remains on the upper portion of the TFT corresponding to the hydrogen blocking layer through the addition of a process of separating ITO from conductive metal using a mask.

Figure 12:
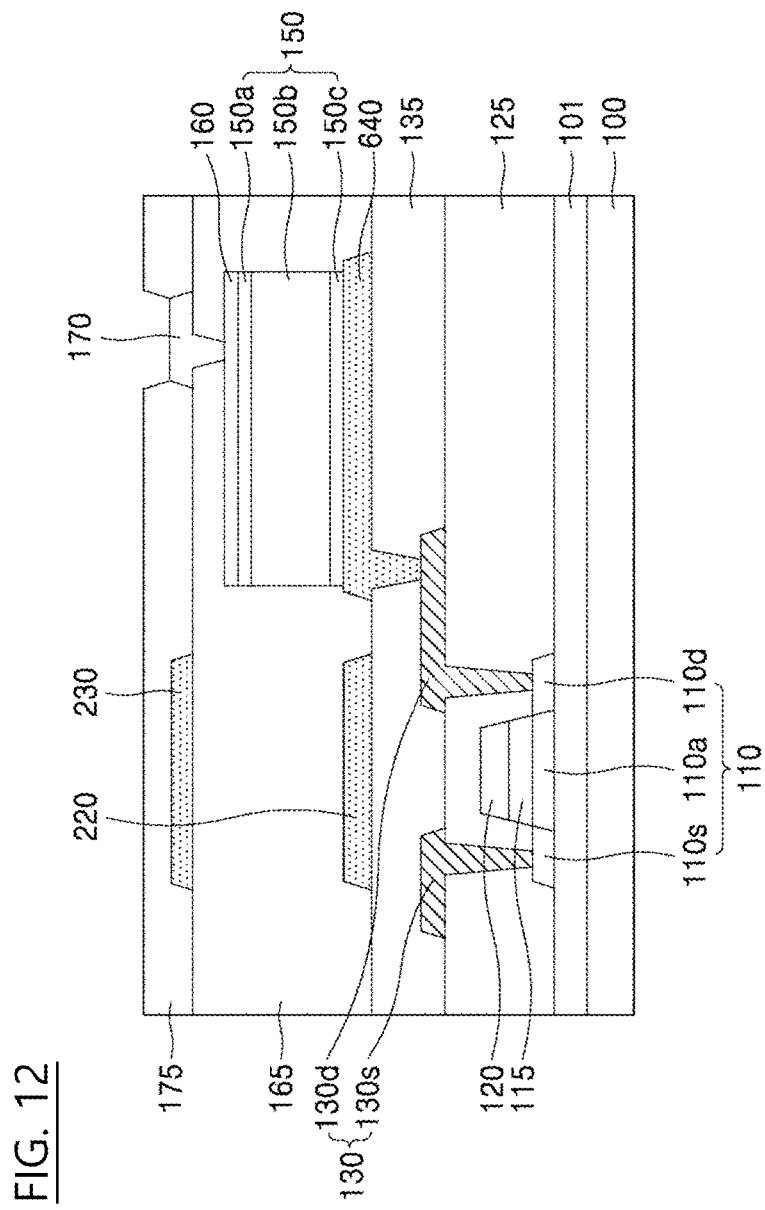

FIG. 12 shows a hydrogen blocking layer arranged on each of a PAS1 and a PAS2 according to another embodiment. When comparing FIG. 12 to FIG. 6, FIG. 12 is the same as FIG. 6 in terms of elements, but is different from FIG. 6 in that a first hydrogen blocking layer 220 may be arranged on the PAS1 135, and a second hydrogen blocking layer 230 may be arrange on the PAS2 165. The embodiments of FIGS. 8 and 9 may be applied to the first hydrogen blocking layer 220 and the pixel electrode 640.

Figure 13:
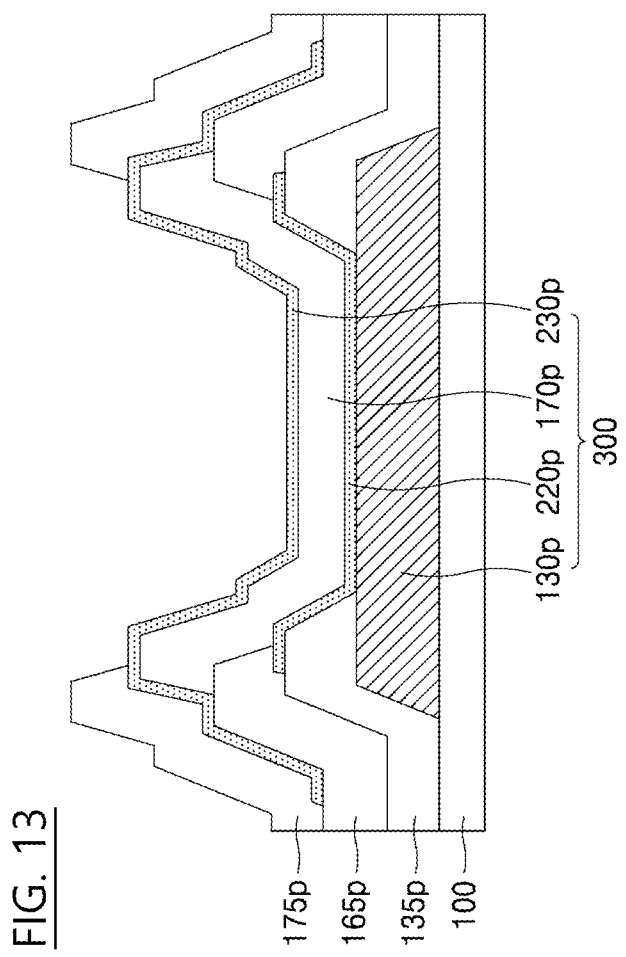

FIG. 13 is a structure of a pad region corresponding to the pixel region of FIG. 12. FIG. 13 shows a structure of a pad arranged in a pad region which is an edge of the substrate 100. In the same manner as the first hydrogen blocking layer 220 and the second hydrogen blocking layer 230 arranged in FIG. 12, one layer 220p of the pad electrode of FIG. 13 may be arranged through the same process as the first hydrogen blocking layer 220 and the pixel electrode of FIG. 12. That is, the pad electrode 300 may include a layer formed of the same material as the first hydrogen blocking layer 220 through the same process as the first hydrogen blocking layer 220. Also, the pad electrode 300 may include a layer 230p formed of the same material and through the same process as the second hydrogen blocking layer.

Referring to FIGS. 12 and 13, the hydrogen blocking layers 220 and 230 may be arranged in a double-layer manner, thereby improving the hydrogen blocking rate. Also, layers formed of the same material the hydrogen blocking layers 220 and 230 may be arranged on the pad electrode 300 through the same process. In particular, a layer formed of the same material (e.g., ITO) as the second hydrogen blocking layer 230 may be arranged as an uppermost layer of the pad electrode 300, thereby protecting the pad electrode 300.

Two hydrogen blocking layers, for example, the first hydrogen blocking layer 220 arranged in the transistor region among the pixel regions of the PAS1 135, and the second hydrogen blocking layer 230 arranged in the transistor region among the pixel regions of the PAS2 165 may block the hydrogen supplied from the upper portion of the transistor region in a double-layer manner to prevent the degradation of the transistor.

And, another layer 230p of the pad electrode may be formed of the same material as the second hydrogen blocking layer 230 through the same process as the second hydrogen blocking layer 230. The process of the pixel region of FIG. 12 and the process of the pad region of FIG. 13 may be performed at the same time. For this reason, the designator "p" is added to an element formed of the same material through the same process. The pad electrode 300 may be arranged through the same process as the process of forming the two hydrogen blocking layers 220 and 230, thereby improving the process efficiency. Further, the uppermost layer of the pad electrode may be formed of ITO, thereby protecting the pad electrode even when no additional process is performed.

More specifically, FIG. 13 shows the pad electrode 300 may include a first layer 130p formed through the same process as the source and drain electrodes 130 of FIG. 12, a second layer 220p formed through the same process as the first hydrogen blocking layer 220 and the pixel electrode 640 of FIG. 12, a third layer 170p formed through the same process as the bias line of FIG. 12, and a fourth layer 230p formed through the same process as the second hydrogen blocking layer 230 of FIG. 12. With respect to the PAS1 135p, the PAS2 165p, and the PAS3 175p, the configurations of the PAS1 to 3 described above are applied thereto.

Figure 14:
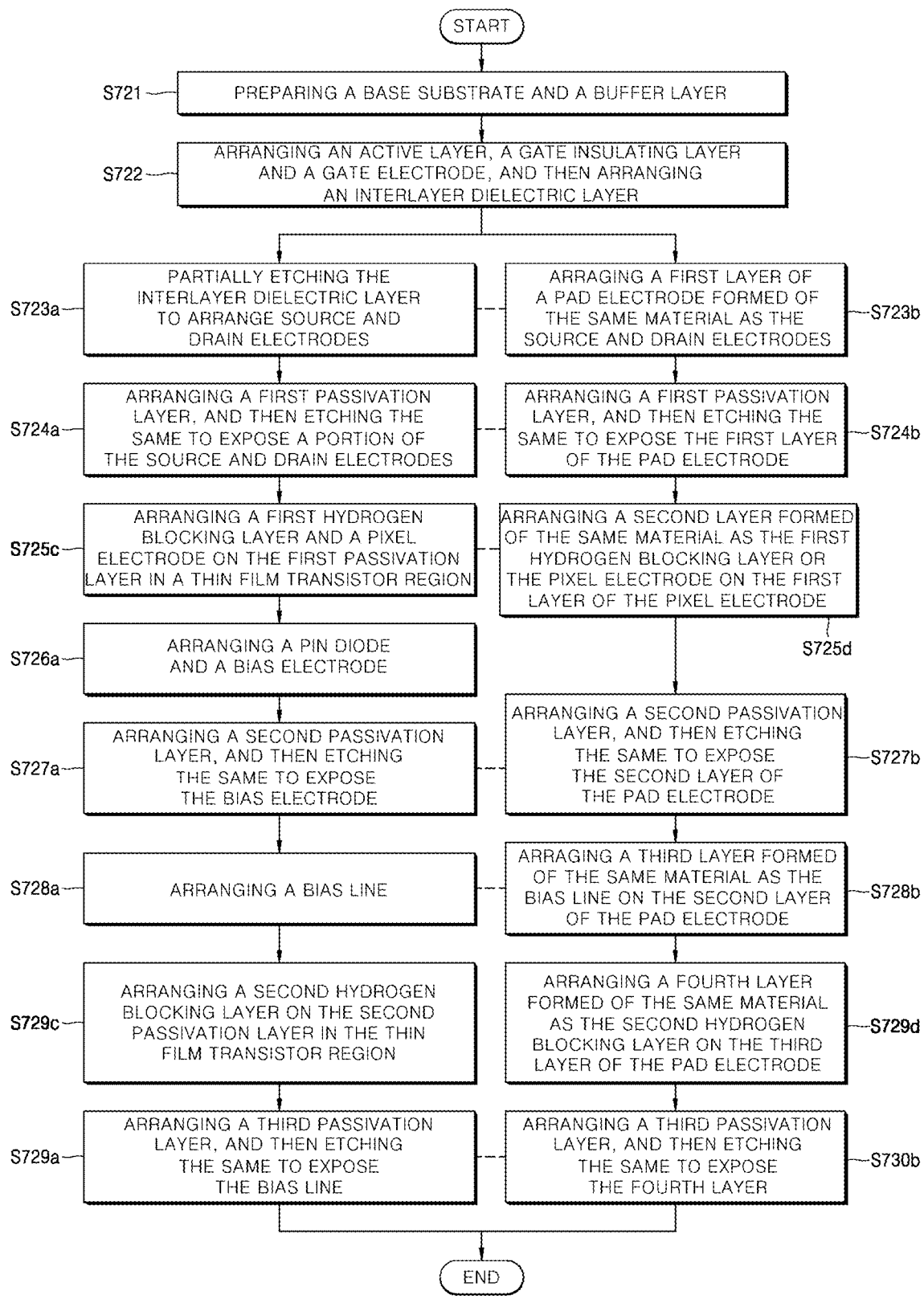

FIG. 14 shows a process of manufacturing a substrate according to an embodiment of the present disclosure. The overall process of FIG. 14 is the same as that of FIG. 11, but is different from that of FIG. 11 in terms of the steps of S725a, S725b and S729b of FIG. 11. Accordingly, in FIG. 14, S725a, S725b and S729b are renumbered as S725c, S725d and S729d, and the step S729c is newly added.

As shown in the step S725c, the first hydrogen blocking layer 220 may be arranged on the PAS1 135. That is, the first hydrogen blocking layer 220 may be arranged on the PAS1 135 in the TFT region among the pixel regions, and the pixel electrode may be arranged on the PAS1 135 in the PD region among the pixel regions (S725c). Here, the hydrogen blocking layer 220 and the pixel electrode 640 may have a single-layered structure formed of an ITO material as shown in FIG. 12. Also, as shown in FIG. 8, the hydrogen blocking layer 220 and the pixel electrode 640 each may have a double-layered structure formed of ITO and conductive metal, that is, may include one layer formed of ITO 220a and 640a and the other layer formed of conductive metal 220b and 640b.

As shown in FIG. 9, the hydrogen blocking layer 220 may have a single-layered structure, and the pixel electrode 640 may include a double-layered structure 640a and 640b. Here, the hydrogen blocking layer 220 and the first layer 640a of the pixel electrode may be formed of ITO and the second layer 640b of the pixel electrode may be formed of conductive metal.

In the pad region, a second layer 220p formed of the same material as the hydrogen blocking layer 220 or the pixel electrode 640 arranged in the pixel region may be arranged on the first layer 130p of the pad electrode through the same process as that of the step S725c of FIG. 14. In the case of the embodiment of FIG. 12, a second layer 220p of the pad electrode may have a single-layered structure formed of only ITO. Alternatively, the second layer 220p of the pad electrode may have a double-layered structure 640a and 640b of the pad electrode 640 as shown in FIG. 10.

In the pixel region, a second hydrogen blocking layer 230 may be arranged on the PAS2 165 in the TFT region, more specifically, in the active layer 110 or the non-conductivized region 110a of the active layer, to prevent hydrogen from flowing into the TFT (S729c). In the pad region, a fourth layer 230p formed of the same material as the second hydrogen blocking layer 230 may be arranged on the third layer 170p through the same process as the second hydrogen blocking layer 230 (S729d).

In the above-described processes, the passivation layer may be used as an inorganic film for reliability of the PD and the transistor. In particular, an inorganic film such as SiO2 or SiNx may be used as the PAS2 165 arranged on the PD. Therefore, it is possible to secure the reliability of the device by using the inorganic film in the process of depositing the passivation layer at a high temperature (deposition of the passivation layer) or performing heat treatment at a high temperature (high heat treatment of the passivation layer).

FIGS. 15 to 19 each show the processes of FIGS. 3 to 5 according to an embodiment of the present disclosure. More specifically, FIGS. 15 to 19 show a process in which elements are laminated in four pixel regions where two gate lines GLm and GL(m+1) and two data lines DLn and DL(n+1), and the elements that are laminated in each pixel region are the same. For ease of convenience, FIGS. 15 to 19 do not show an interlayer dielectric layer and a plurality of passivation layers, but show elements arranged under the interlayer dielectric layer and the plurality of passivation layers.

Figure 15:
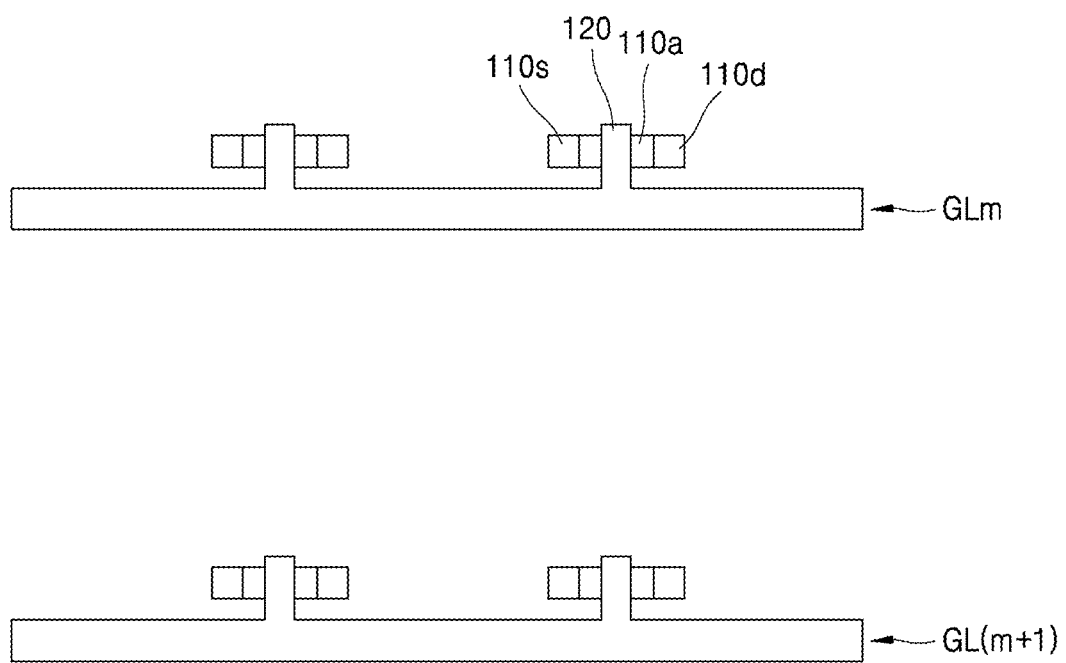
FIGS. 15 to 19 each show processes of FIGS. 3 to 5 according to an embodiment of the present disclosure.
Figure 16:
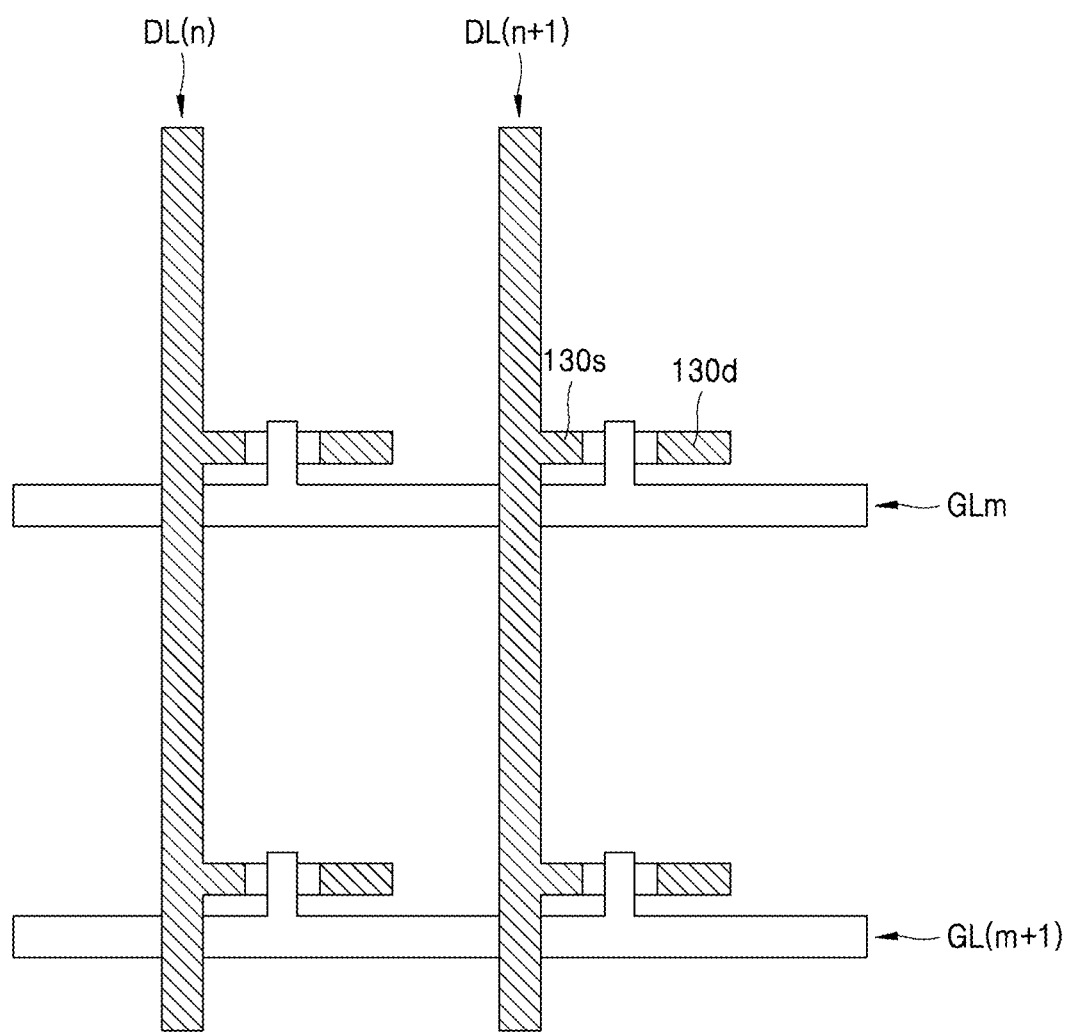

FIG. 15 shows a state in which the gate lines GLm and GL(m+1) and the gate electrode 120 are arranged on the active layers 110a, 110s and 110d, and some 110s and 110d of the active layers 110a, 110s and 110d are conductivized through a doping process. Subsequently, the interlayer dielectric layer 125 may be arranged thereon (not shown in FIG. 15), and then the data lines DLn and DL(n+1) arranged on the the interlayer dielectric layer 125 as shown in FIG. 16. Also, FIG. 16 shows a state in which the source and drain electrodes 130s and 130d are electrically connected to the conductivized regions 110s and 110d of the active layer.

Figure 17:
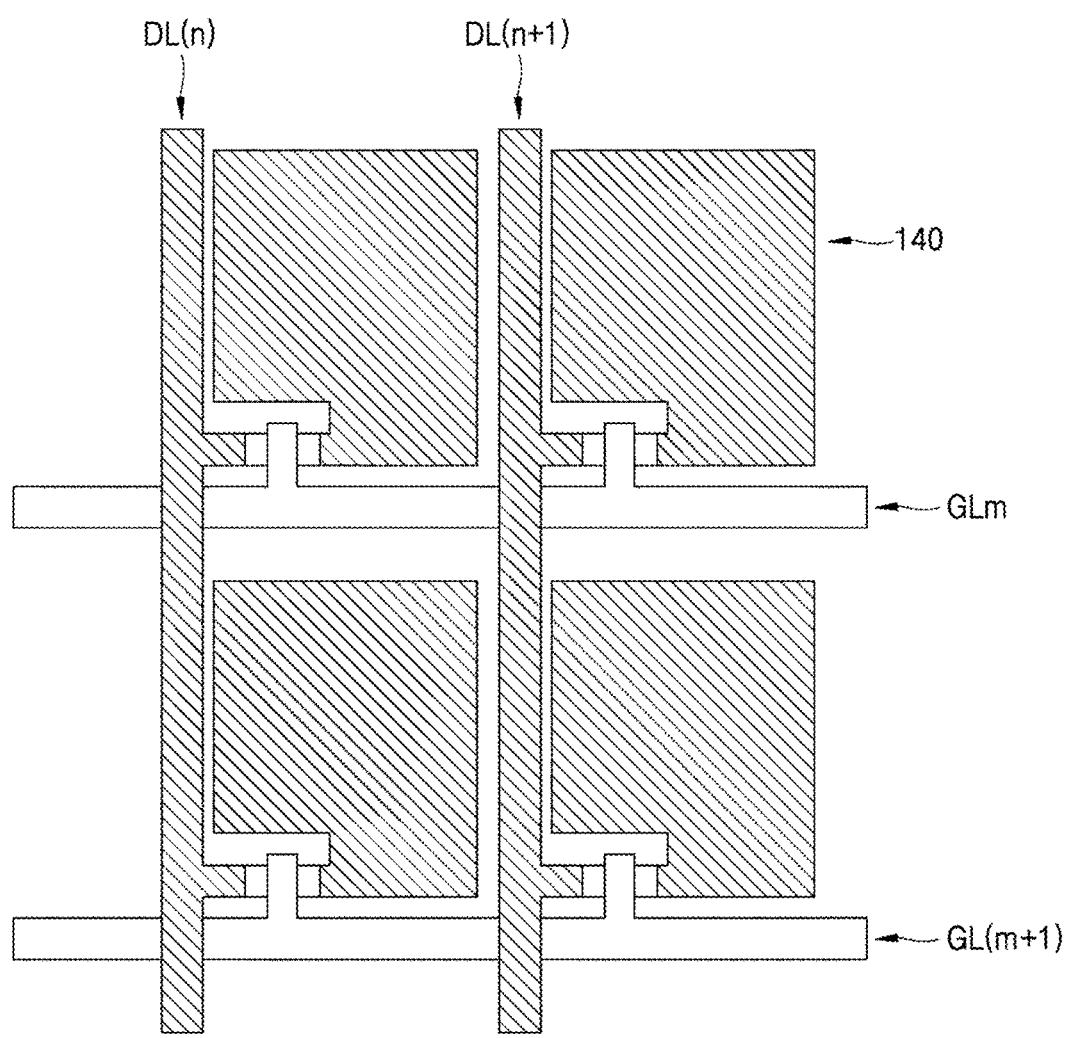
Figure 18:
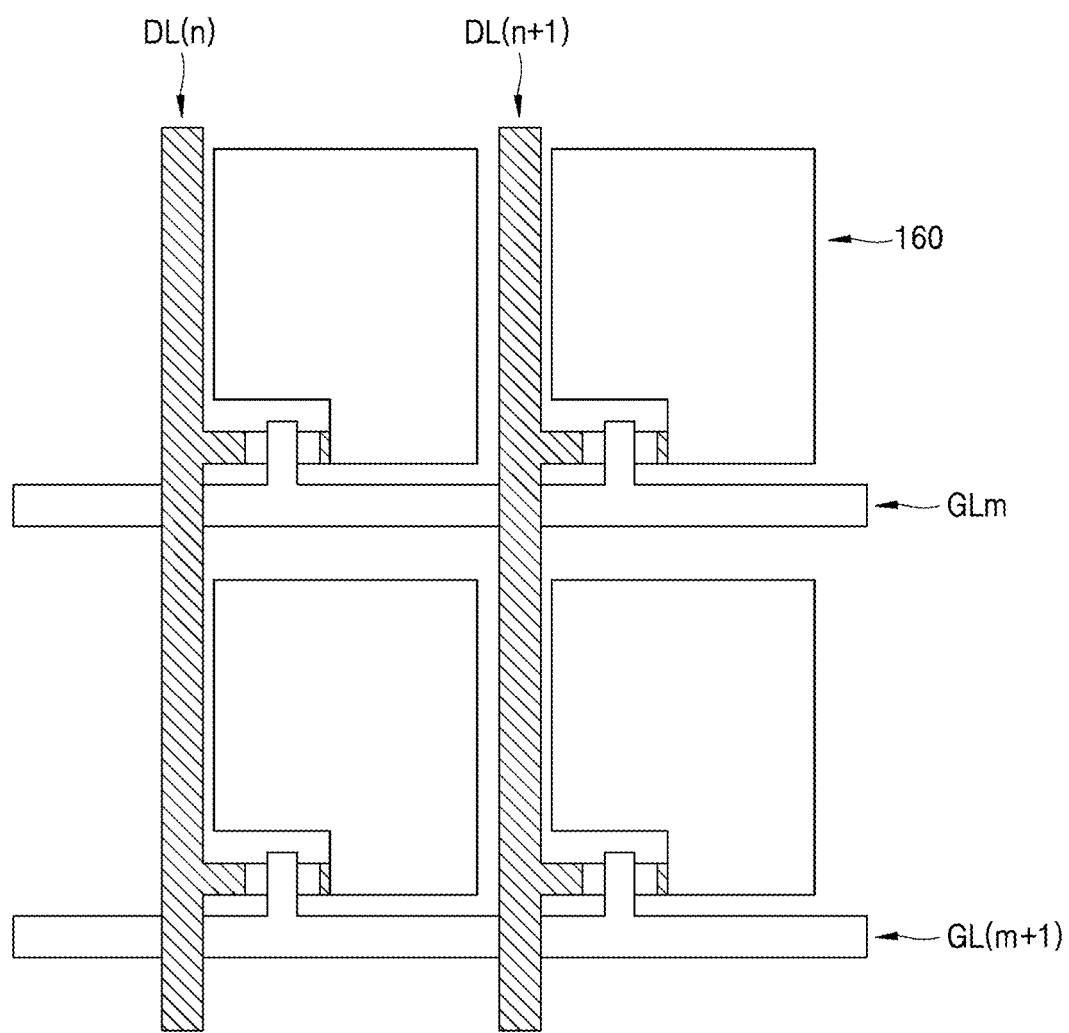

Subsequently, the PAS1 135 may be arranged thereon (not shown in FIG. 16), and then the pixel electrode 140 may be arranged on the PAS1 135 as shown in FIG. 17. The pixel electrode 140 may be formed of the same material as the source and drain electrodes 130s and 130d. FIG. 18 shows the PIN layer 150 and the bias electrode 160 of the PD arranged on the pixel electrode 140. Subsequently, the PAS2 165 may be arranged thereon (not shown in FIG. 18), and then bias lines BLn and BL(n+1) may be arranged on the PAS2 165. Also, the hydrogen blocking layer 210 may be arranged on the PAS2 165 in the transistor region. The cross-section taken along line A-A' of FIG. 19 will be described with reference to FIG. 3.

Figure 19:
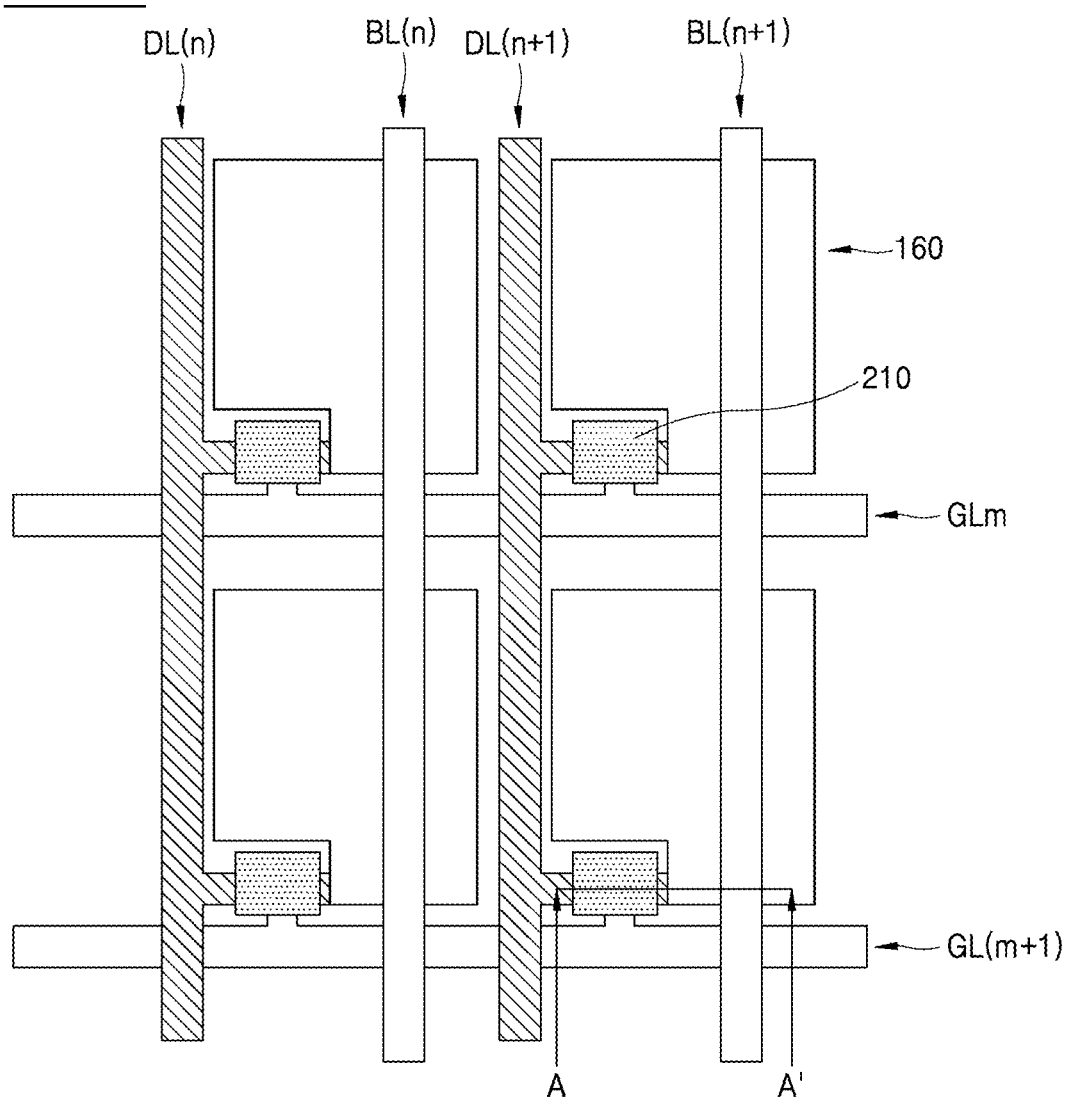
Figure 20:
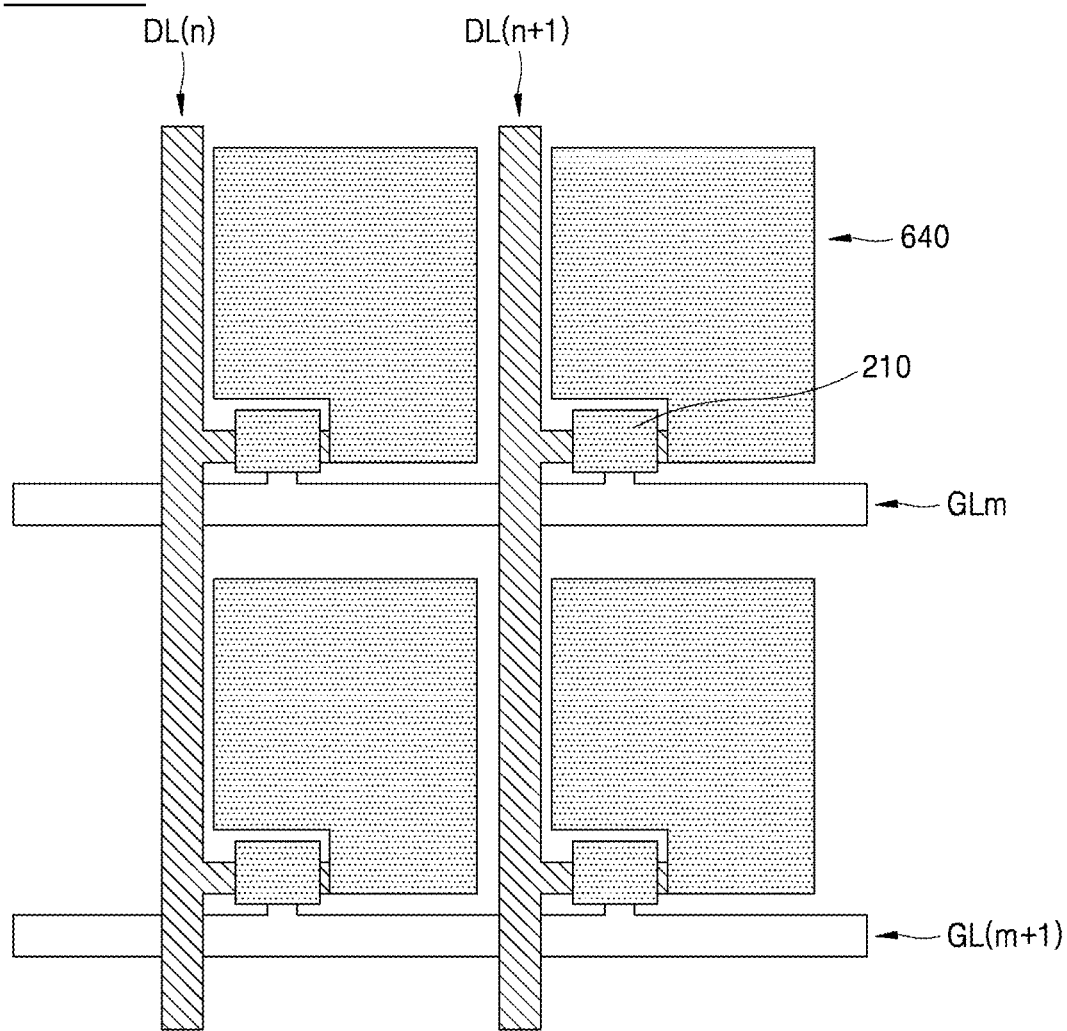
FIGS. 20 to 22 each show processes of FIGS. 6 and 7 according to an embodiment of the present disclosure.
Figure 21:
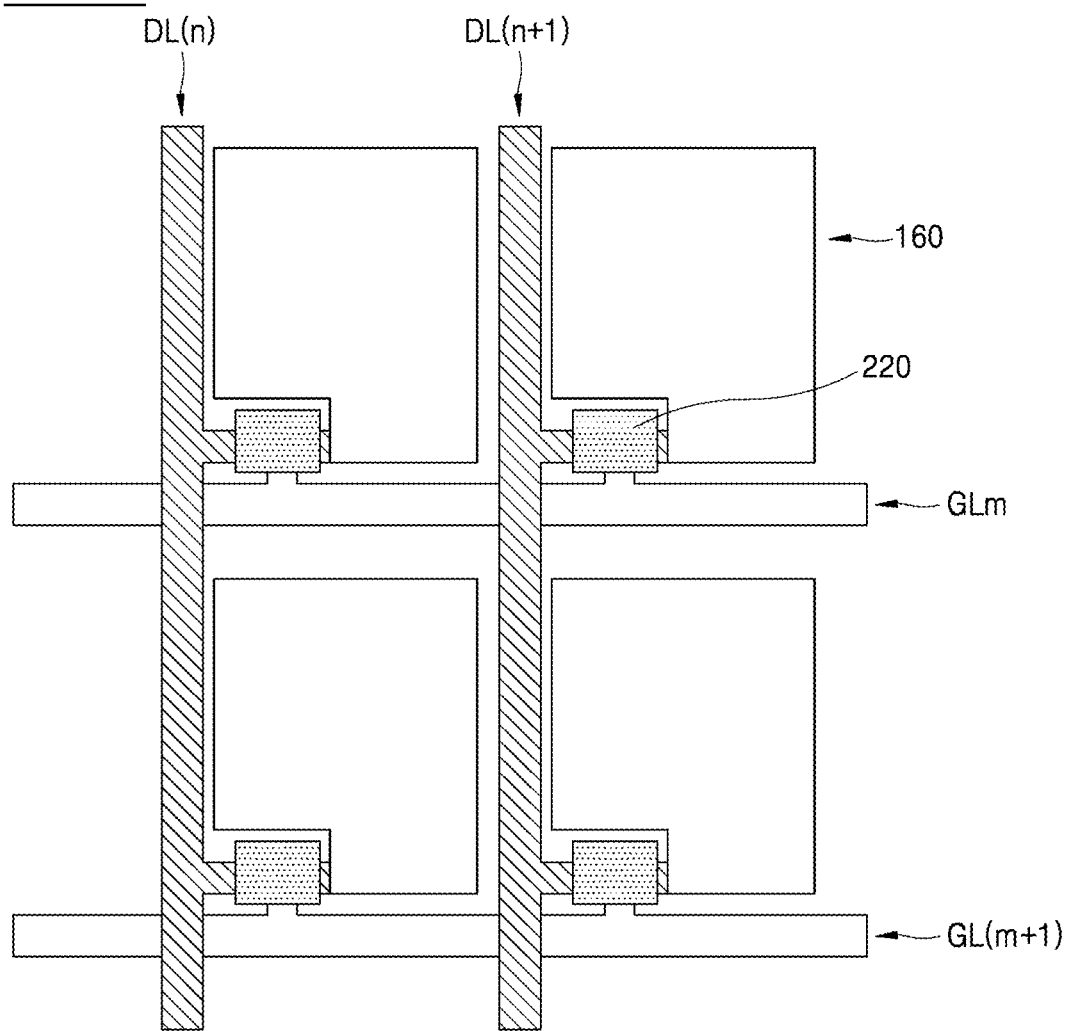
Figure 22:
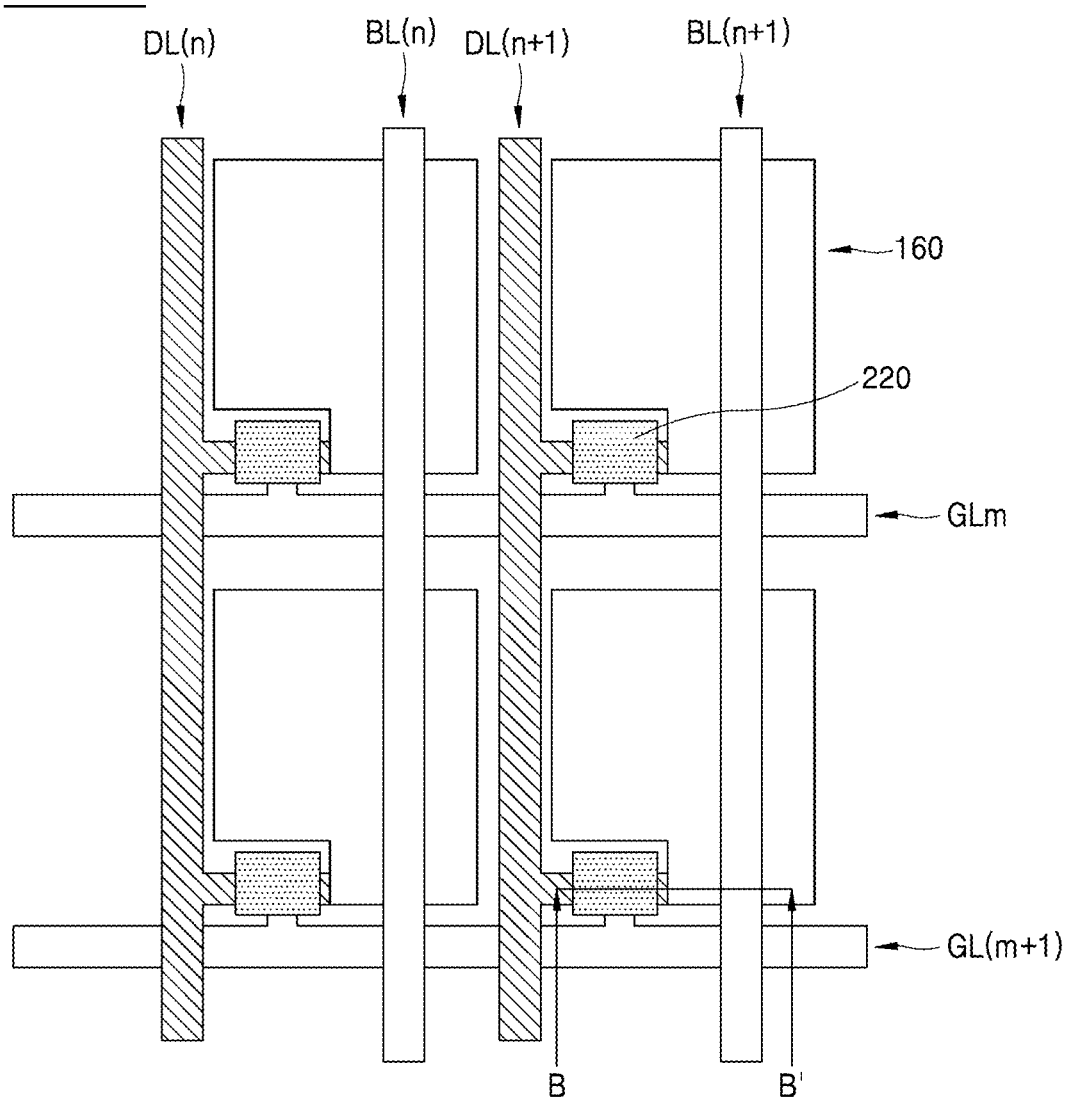

FIGS. 20 to 22 show the configurations of FIGS. 6 and 7 according to an embodiment. With respect to elements of FIGS. 20 to 22 the same as those of FIGS. 15 to 19, the elements of FIGS. 15 to 19 are to be referenced herein.

The transistor and the data lines DLn and DL(n+1) may be arranged as shown in FIGS. 15 and 16. Also, elements formed after the source and drain electrodes 130s and 130d are arranged will be described with reference to FIG. 20.

In FIG. 20, the pixel electrode 640 and the hydrogen blocking layer 220 may be arranged through the same process. Here, the pixel electrode 640 and the hydrogen blocking layer 220 may have a single-layered structure formed of only ITO. Alternatively, the pixel electrode 640 and the hydrogen blocking layer 220 may have a double-layered structure as shown in FIG. 8. FIG. 21 shows the PIN layer of the PD and the bias electrode 160 arranged on the pixel electrode 640.

Subsequently, the PAS2 165 may be arranged thereon (not shown in FIG. 22), and then the bias lines BLn and BL(n+1) may be arranged on the PAS2 165 as shown in FIG. 22. The cross-section taken along line B-B' of FIG. 22 will be described with reference to FIG. 6. When a hydrogen blocking layer is arranged in a double-layer manner, a hydrogen blocking layer (230 of FIG. 12) may be arranged on a hydrogen blocking layer 220 in the manner as shown in FIG. 19, according to an embodiment.

According to an embodiment, the hydrogen blocking layer may be arranged in a double-layered manner by arranging the first hydrogen blocking layer 220 and then arranging the second hydrogen blocking layer 230 at a position corresponding to the first hydrogen blocking layer 220, as shown in FIG. 12.

In a conventional a-Si applied DXD structure, a subsequent process of arranging a diode did not cause the degradation of the device. But, in the case of applying the oxide TFT, hydrogen was penetrated into an active layer to cause the degradation of the device during the process of arranging the diode using CVD (PIN layer, second protective layer (PAS2), third protective layer (PAS3)), and as a result, the active layer was conductivized. According to embodiments, the hydrogen blocking layer may prevent a phenomenon of being conductivized, thereby preventing the degradation of the transistor.

Figure 23:
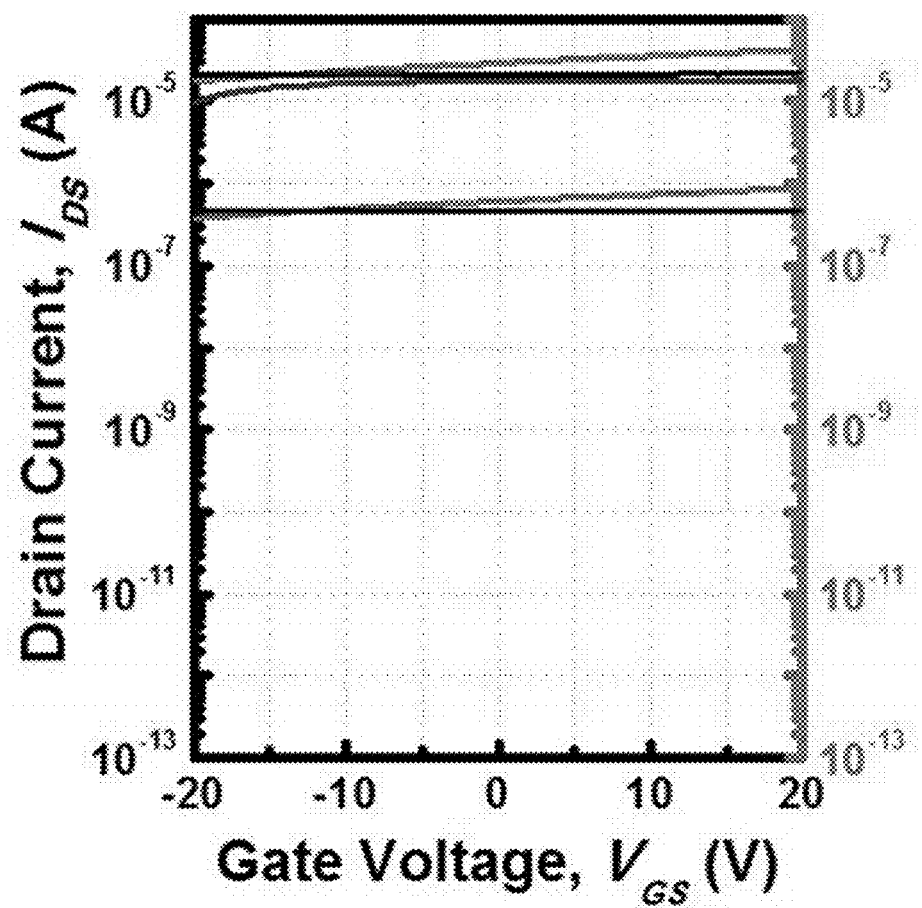
FIG. 23 shows a case in which a hydrogen blocking layer is not applied according to an embodiment of the present disclosure.

FIG. 23 shows a case in which a hydrogen blocking layer is not applied according to an embodiment. From FIG. 23, it is apparent that a current flows toward a drain electrode, i.e., a drain current, regardless of a voltage of the gate electrode.

Figure 24:
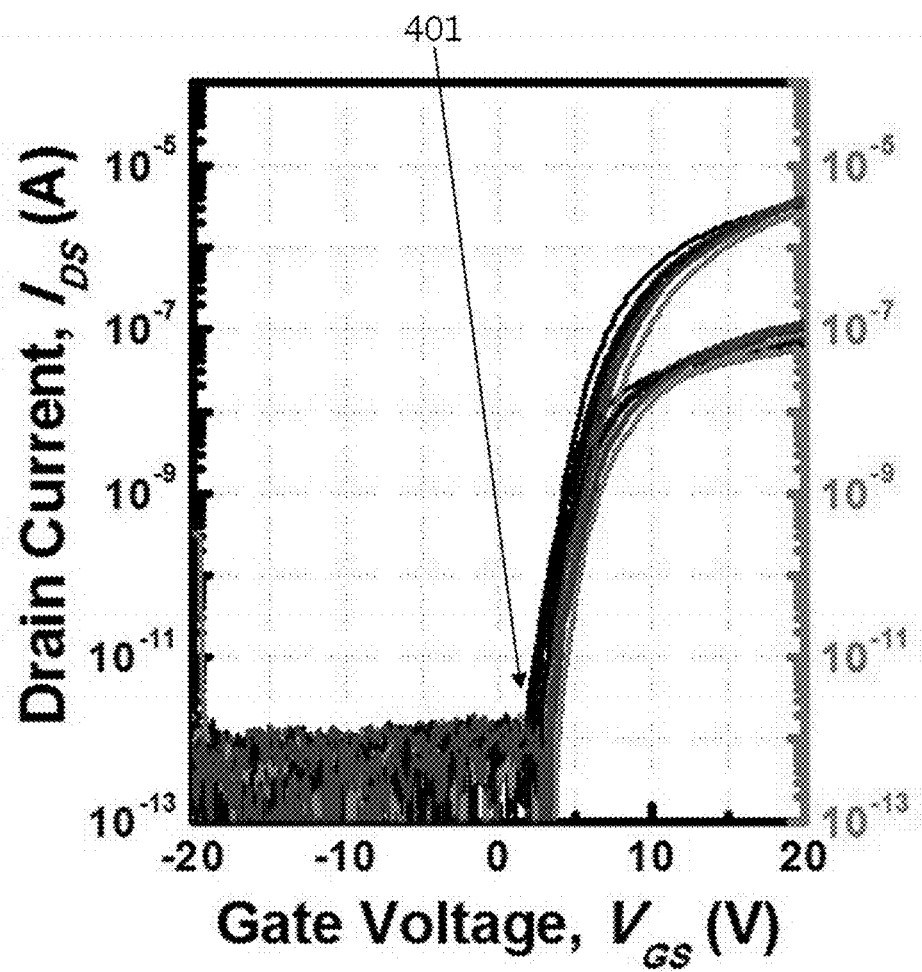
FIG. 24 shows a case in which a hydrogen blocking layer is applied according to an embodiment of the present disclosure.

FIG. 24 shows a case in which a hydrogen blocking layer is applied according to an embodiment. From FIG. 24, it is apparent that the current flows toward the drain electrode according to the gate voltage of the gate electrode (see 401).

According to embodiments of the present disclosure, an upper portion of the TFT may be formed of ITO to block the hydrogen that may flow into the TFT during the process, thereby preventing the degradation of the device. Also, a window may be widened in the process of arranging the diode on the TFT. That is, it is possible to widen a window in the process of arranging the PIN diode and a window in the process of arranging the passivation layer (SiON, SiNx and the like) to be applied to the upper portion of the TFT.

When the hydrogen blocking layer including ITO is arranged on the IGZO in the TFT region as in the above-described embodiments, it is possible to block hydrogen which may flow into the TFT in the process of depositing the PIN diode and the passivation layer, thereby reduce the influence of the hydrogen on the TFT. The hydrogen blocking layer may be arranged in an island form, and may be electrically connected to another hydrogen blocking layer in an adjacent pixel region. For example, the hydrogen blocking layer arranged for each pixel may be electrically connected to another hydrogen blocking layer of an adjacent pixel, which means the hydrogen blocking layer arranged for each pixel may be electrically connected to hydrogen blocking layers of adjacent pixels among the four hydrogen blocking layers denoted by reference numeral 220 in FIG. 22.

Embodiments of the present disclosure are summarized as follows.

According to an embodiment of the present disclosure, a substrate for a DXD may include an interlayer dielectric layer arranged on a TFT, a PAS1 and a PAS2 arranged on the interlayer dielectric layer, and a hydrogen blocking layer arranged on at least one of the PAS1 and the PAS2 in a transistor region corresponding to the TFT.

According to an embodiment the present disclosure, a substrate for a DXD may include a pad electrode in a pad region may include a layer formed of the same material and through the same process as a hydrogen blocking layer.

According to an embodiment of the present disclosure, a DXD may include a substrate, which may include an interlayer dielectric layer arranged on a TFT, a PAS1 and a PAS2 arranged on the interlayer dielectric layer, and a hydrogen blocking layer arranged on at least one of the PAS1 and the PAS2 in a transistor region corresponding to the TFT.

According to an embodiment the present disclosure, a DXD may include a substrate, which may include a pad electrode in a pad region may include a layer formed of the same material and through the same process as a hydrogen blocking layer.

According to another embodiment of the present disclosure, a method of manufacturing a substrate for DXD may include the steps of arranging a TFT and a PD, arranging a PAS2 on the PD, and arranging a hydrogen blocking layer on the PAS2 in a transistor region corresponding to the TFT among the pixel regions.

The method of manufacturing a substrate for DXD may further include arranging a first hydrogen blocking layer on an interlayer dielectric layer and a PAS1 arranged on the TFT in the transistor region corresponding to the TFT among the pixel regions, and arranging a pixel electrode formed of the same material as the first hydrogen blocking layer in a PD region among the pixel regions.

The present disclosure is described with reference to embodiments described herein and accompanying drawings, but is not limited thereto. It should be apparent to those skilled in the art that various changes or modifications which are not exemplified herein but are still within the spirit and scope of the present disclosure may be made.

What is claimed:

1. A substrate for a digital X-ray detector comprising:
a base substrate comprising an active region including a plurality of pixel regions and a pad region outside the active region;
a plurality of gate lines arranged in a first direction on the active region of the base substrate;
a plurality of data lines arranged in a second direction to intersect with the first direction on the active region of the base substrate;
a plurality of bias lines arranged in the first direction or the second direction on the active region of the base substrate;
a plurality of thin film transistors corresponding to the plurality of pixel regions, each of the thin film transistors arranged at an intersection between the gate lines and the data lines, and each of the thin film transistors comprising source and drain electrodes on an interlayer dielectric layer;
a first passivation layer arranged on the interlayer dielectric layer and configured to cover the source and drain electrodes of the plurality of thin film transistors;
a plurality of photodiodes arranged on the first passivation layer and corresponding to the plurality of pixel regions, each of the photodiodes electrically connected to each of the thin film transistors;
a second passivation layer arranged on the first passivation layer and configured to cover the plurality of photodiodes;
a first hydrogen blocking layer arranged on the second passivation layer, overlapped with an active layer of each of the thin film transistors and comprising a transparent conductive material; and
a pad electrode arranged on the pad region of the base substrate and comprising a layer formed of the same material and formed through the same process as the first hydrogen blocking layer.

2. The substrate for a digital X-ray detector of claim 1, wherein an uppermost layer of the pad electrode is formed of the same material and formed through the same process as the first hydrogen blocking layer.

3. The substrate for a digital X-ray detector of claim 1, further comprising:
a second hydrogen blocking layer arranged on the first passivation layer, overlapped with an active layer of each of the thin film transistors and comprising a transparent conductive material,
wherein each of the photodiodes comprises a pixel electrode arranged on the first passivation layer and being apart from the second hydrogen blocking layer, the pixel electrode comprising a layer formed of the same material and formed through the same process as the second hydrogen blocking layer.

4. The substrate for a digital X-ray detector of claim 3, wherein each of the second hydrogen blocking layer and the pixel electrode comprises:
a first layer arranged on the first passivation layer and including Indium tin oxide (ITO); and
a second layer arranged on the first layer and including conductive metal.

5. The substrate for a digital X-ray detector of claim 3, wherein
the hydrogen blocking layer includes Indium tin oxide (ITO), and
the pixel electrode comprises:
a first layer arranged on the first passivation layer and including the ITO and
a second layer arranged on the first layer and including conductive metal.

6. The substrate for a digital X-ray detector of claim 3, wherein the pad electrode further comprises:
a first layer formed of the same material and through the same process as the source and drain electrodes of the thin film transistors, and
a second layer formed of the same material and through the same process as the bias lines,
wherein the plurality of bias lines are arranged on the second passivation layer,
wherein the first hydrogen blocking layer is apart from the bias lines.

7. A digital X-ray detector, comprising:
a substrate comprising an active region including a plurality of pixel regions and a pad region outside the active region;
a plurality of gate lines arranged in a first direction on the active region of the base substrate;
a plurality of data lines arranged in a second direction to intersect with the first direction on the active region of the base substrate;
a plurality of bias lines arranged in the first direction or the second direction on the active region of the base substrate;
a plurality of thin film transistors corresponding to the plurality of pixel regions, each of the thin film transistors arranged at an intersection of the gate lines and the data lines, and each of the thin film transistors comprising source and drain electrodes on an interlayer dielectric layer;
a first passivation layer arranged on the interlayer dielectric layer and configured to cover the source and drain electrodes of the plurality of thin film transistors;
a plurality of photodiodes arranged on the first passivation layer and corresponding to the plurality of pixel regions, each of the photodiodes electrically connected to each of the thin film transistors;
a second passivation layer arranged on the first passivation layer and configured to cover the plurality of photodiodes;
a first hydrogen blocking layer arranged on the second passivation layer, overlapped with an active layer of each of the thin film transistors and comprising a transparent conductive material;
a pad electrode arranged on the pad region of the base substrate and comprising a layer formed of the same material and formed through the same process as the first hydrogen blocking layer;
a gate driver connected to each of the gate lines;
a read-out circuit unit connected to each of the data lines; and
a bias driver connected to each of the bias lines.

8. The digital X-ray detector of claim 7,
wherein an uppermost layer of the pad electrode is formed of the same material and formed through the same process as the first hydrogen blocking layer.

9. The digital X-ray detector of claim 7, further comprising:
a second hydrogen blocking layer arranged on the first passivation layer, overlapped with an active layer of each of the thin film transistors and comprising a transparent conductive material,
wherein each of the photodiodes comprises a pixel electrode arranged on the first passivation layer and being apart from the second hydrogen blocking layer, the pixel electrode comprising a layer formed of the same material and formed through the same process as the second hydrogen blocking layer.

10. The digital X-ray detector of claim 9, wherein each of the second hydrogen blocking layer and the pixel electrode comprises:
a first layer arranged on the first passivation layer and including Indium tin oxide (ITO); and
a second layer arranged on the first layer and including conductive metal.

11. The digital X-ray detector of claim 9, wherein
the hydrogen blocking layer includes Indium tin oxide (ITO), and
the pixel electrode comprises:
a first layer arranged on the first passivation layer and including the ITO and
a second layer arranged on the first layer and including conductive metal.

12. The digital X-ray detector of claim 9, wherein the pad electrode further comprises:
a first layer formed of the same material and through the same process as the source and drain electrodes of the thin film transistors, and
a second layer formed of the same material and through the same process as the bias lines,
wherein the plurality of bias lines are arranged on the second passivation layer,
wherein the first hydrogen blocking layer is apart from the bias lines.

13. A method of manufacturing a substrate for a digital X-ray detector, comprising:
forming at least one thin film transistor in an active region of a base substrate, each of the at least one thin film transistor comprising an active layer, a gate insulating layer on a portion of the active layer, a gate electrode on the gate insulating layer, an interlayer dielectric layer arranged on the base substrate and configured to cover the active layer and the gate electrode, and source and drain electrodes arranged on the interlayer dielectric layer;
forming a first passivation layer configured to cover the source and drain electrodes of the at least one thin film transistor on the interlayer dielectric layer;
forming photodiodes on the first passivation layer;
forming a second passivation layer configured to cover the photodiodes on the first passivation layer; and
forming a first hydrogen blocking layer on the second passivation layer, the first hydrogen blocking layer overlapped with the active layer of each of the at least one thin film transistor and comprising a transparent conductive material,
wherein each of the photodiodes includes a pixel electrode arranged on the first passivation layer,
wherein, in step of forming the pixel electrode, a second hydrogen blocking layer is further formed on the first passivation layer, the second hydrogen blocking layer overlapped with the active layer of each of the at least one thin film transistor and comprising a transparent conductive material.

14. The method of claim 13,
wherein, in the step of forming the first hydrogen blocking layer, a layer of a pad electrode is further formed of the same material as the first hydrogen blocking layer on a pad region of the base substrate,
wherein the pad region is outside the active region.

15. A method of manufacturing a substrate for a digital X-ray detector, further comprising:
forming at least one thin film transistor in an active region of a base substrate, each of the at least one thin film transistor comprising an interlayer dielectric layer configured to cover an active layer, source and drain electrodes on the interlayer dielectric layer;
forming a first passivation layer configured to cover the source and drain electrodes of the at least one thin film transistor on the interlayer dielectric layer;
forming a pixel electrode of a photodiode on the first passivation layer;
forming a PIN diode of the photodiode on the pixel electrode and a bias electrode of the photodiode on the PIN diode;
forming a second passivation layer configured to cover the photodiode on the first passivation layer;
forming a first hydrogen blocking layer on the second passivation layer, the first hydrogen blocking layer overlapped with the active layer of each of the at least one thin film transistor and comprising a transparent conductive material;
forming a contact hole in the second passivation layer;
forming a bias line being electrically connected to the bias electrode via the contact hole, the bias line being apart from the first hydrogen blocking layer.

16. The method of claim 15,
wherein, in the step of forming the first hydrogen blocking layer, a layer of a pad electrode is further formed of the same material as the first hydrogen blocking layer on a pad region of the second passivation layer, wherein the pad region is outside the active region.

17. The method of claim 15, wherein, in the step of forming the pixel electrode, a second hydrogen blocking layer is further formed on the first passivation layer, the second hydrogen blocking layer overlapped with the active layer of each of the at least one thin film transistor and comprising a transparent conductive material.

18. The method of claim 17, wherein, in the step of forming the pixel electrode, a layer of a pad electrode is further formed of the same material as the second hydrogen blocking layer on a pad region of the first passivation layer, wherein the pad region is outside the active region.

* * * * *